United States Patent
Ichiriu et al.

(10) Patent No.: US 6,597,595 B1
(45) Date of Patent: Jul. 22, 2003

(54) CONTENT ADDRESSABLE MEMORY WITH ERROR DETECTION SIGNALING

(75) Inventors: Michael E. Ichiriu, Cupertino, CA (US); Varadarajan Srinivasan, Los Altos Hills, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/954,827

(22) Filed: Sep. 18, 2001

Related U.S. Application Data

(63) Continuation-in-part of application No. 09/922,423, filed on Aug. 3, 2001.

(51) Int. Cl.$^7$ .............................................. G11C 15/00
(52) U.S. Cl. .................... 365/49; 365/201; 365/189.07; 711/108
(58) Field of Search .................... 365/49, 201, 189.07; 711/108

(56) References Cited

U.S. PATENT DOCUMENTS

| 4,112,502 A | 9/1978 | Scheuneman |
| 4,747,080 A | 5/1988 | Yamada |
| 5,491,703 A | 2/1996 | Barnaby et al. |
| 5,796,758 A | 8/1998 | Levitan |
| 5,872,802 A | 2/1999 | Knaack et al. |
| 6,154,384 A | 11/2000 | Nataraj et al. |
| 6,199,140 B1 | 3/2001 | Srinivasan et al. |
| 6,243,281 B1 | 6/2001 | Pereira |
| 6,324,087 B1 * | 11/2001 | Pereira ........................ 365/49 |
| 2002/0075714 A1 * | 6/2002 | Pereira et al. ................ 365/49 |

OTHER PUBLICATIONS

"Error Correction with Hamming Codes," pp. 1–2 downloaded Jun. 22, 2001 from URL http://www.rad.com/networks/1994/err_con/hamming.htm.

* cited by examiner

*Primary Examiner*—Michael S. Lebentritt
*Assistant Examiner*—Toan Le
(74) *Attorney, Agent, or Firm*—Shemwell Gregory & Courtney LLP

(57) ABSTRACT

A content addressable memory (CAM) device having a data CAM array and an error CAM array. The data CAM array is provided to store data words, compare the data words with a comparand value, and, if one of the data words matches the comparand value, assert a match signal that corresponds to the matching data word. A priority encoder responds to the match signal by outputting a match address that corresponds to the matching data word. The error CAM array is provided to store at least one error address value and is coupled to the priority encoder to receive the match address. The error CAM array compares the match address with the error address value and asserts a match error signal if the match address matches the error address value.

30 Claims, 26 Drawing Sheets

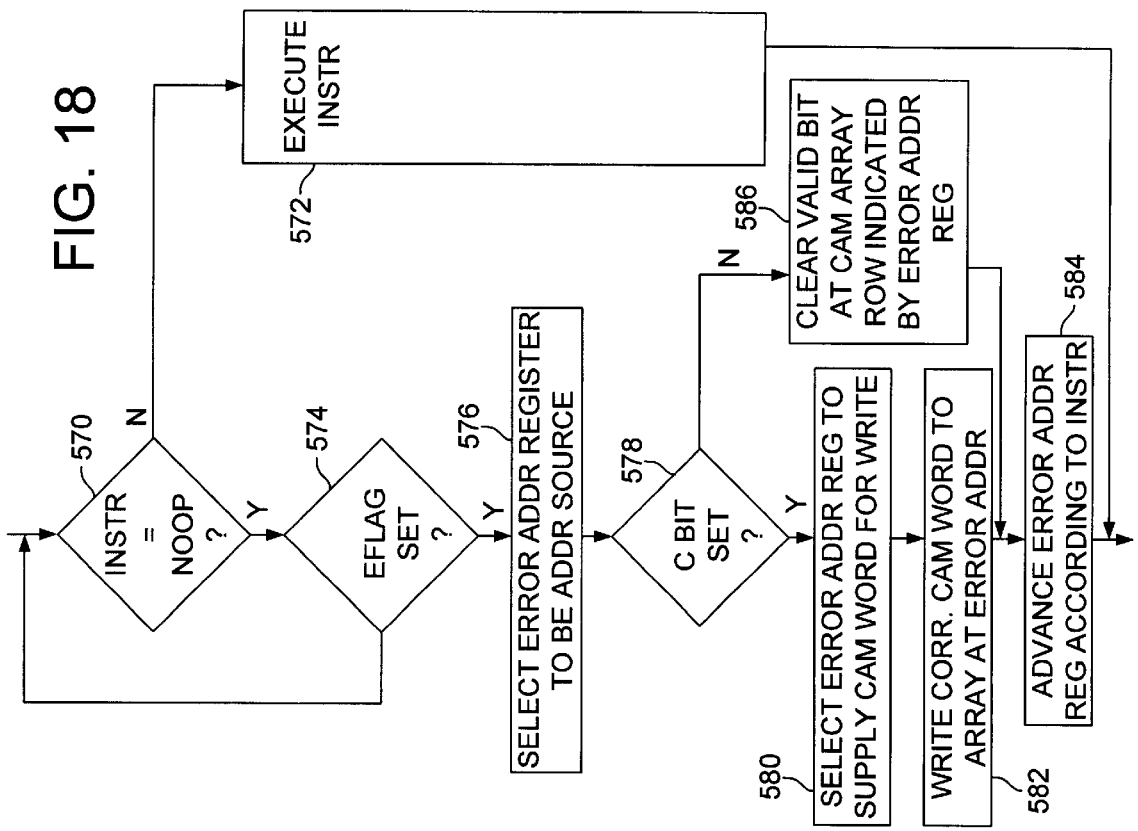
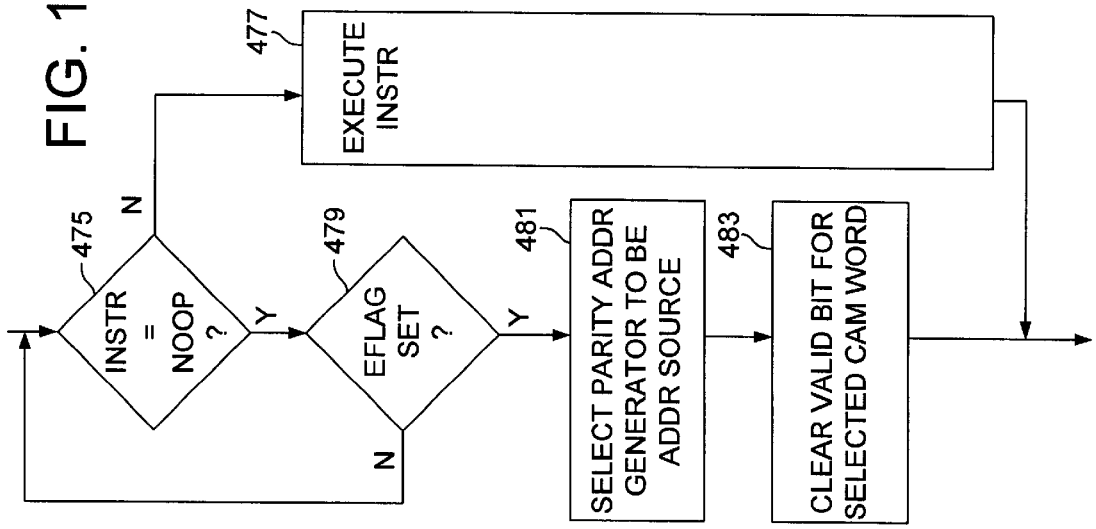

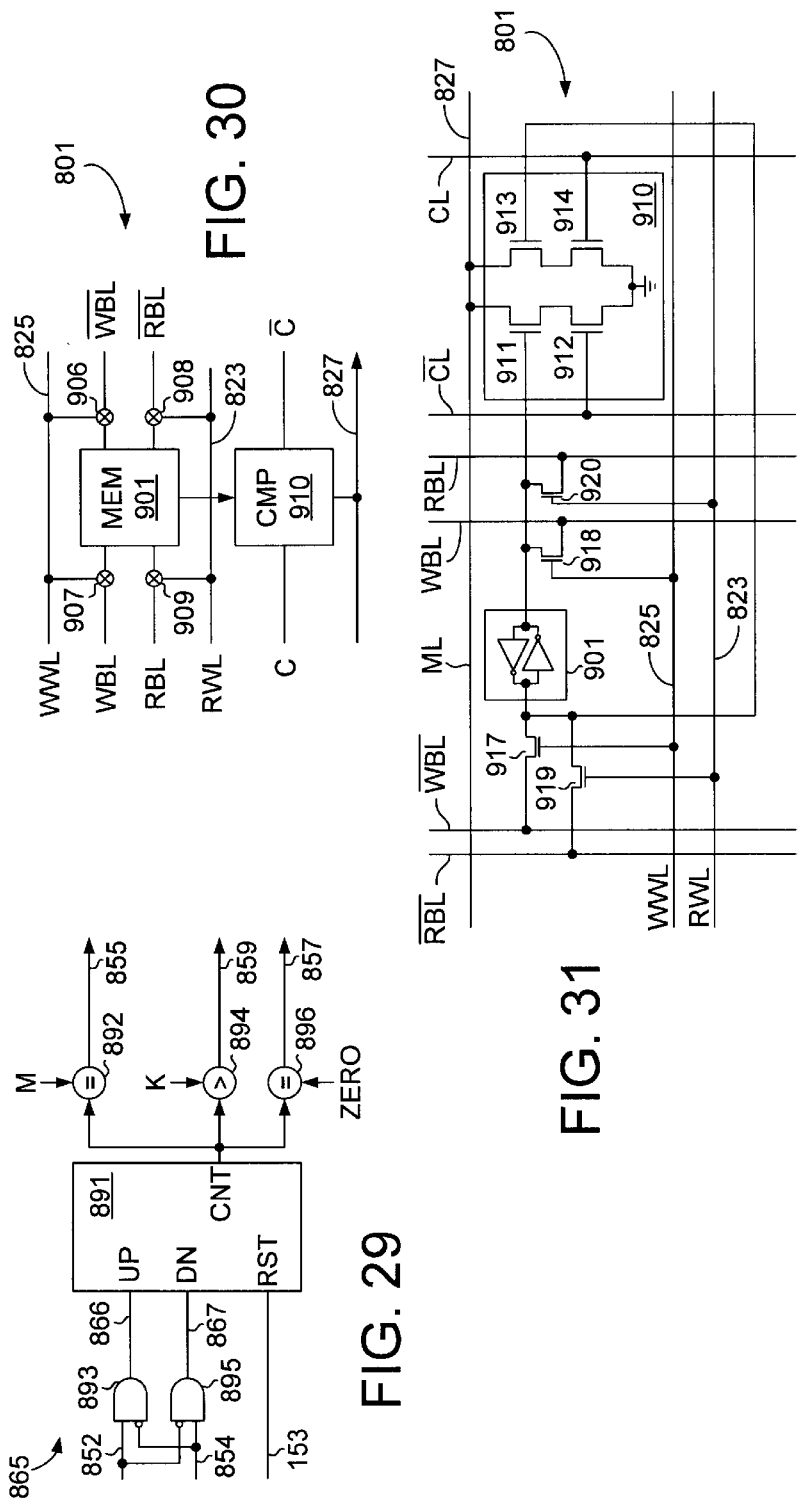

CONTENT ADDRESSABLE MEMORY WITH ERROR DETECTION SIGNALING

CROSS-REFERENCE TO RELATED APPLICATIONS

This application is a continuation-in-part of U.S. patent application Ser. No. 09/922,423, filed Aug. 3, 2001. U.S. patent application Ser. No. 09/922,423, pending, is hereby incorporated by reference in its entirety.

FIELD OF THE INVENTION

The present invention relates generally to content addressable memory devices, and more particularly to error detection within content addressable memory devices.

BACKGROUND

Content addressable memory (CAM) devices are often used in network switching and routing applications to determine forwarding destinations for data packets. A CAM device can be instructed to compare a selected portion of an incoming packet, typically a destination field within the packet header, with data values, called CAM words, stored in an associative storage array within the CAM device. If the destination field matches a CAM word, the CAM device records a CAM index that identifies the location of the matching CAM word within the storage array, and asserts a match flag to signal the match. The CAM index is then typically used to index another storage array, either within or separate from the CAM device, to retrieve a destination address or other routing information for the packet.

Any corruption of CAM words stored within a CAM device (e.g., due to alpha particle bombardment or failure of a storage cell within the CAM device) may result in a false match/non-match determination and ultimately in non-delivery of packets or delivery of packets to an incorrect destination. While it is known to store parity information in the CAM device for error detection purposes, the parity information is generally used to detect errors only when a host device instructs the CAM device to perform a read operation (i.e., output a CAM word). That is, parity checking is not performed during a typical compare operation because the CAM word is usually not read during such an operation. Moreover, any interruption of the normal operation of the CAM device, for example to read CAM words for error detection purposes, reduces the number of timing cycles available for compare operations, effectively lowering the compare bandwidth of the CAM device.

SUMMARY

A content addressable memory (CAM) device having a CAM storage array and circuitry to detect errors in the CAM storage array is disclosed in numerous embodiments. In at least one embodiment, the CAM device includes circuitry to identify errors in the CAM storage array concurrently with performing host-requested compare operations, thereby providing an error checking function without reducing the compare bandwidth of the CAM device. Further embodiments include circuitry to log errors and error addresses in an error address register for subsequent host inspection, and circuitry to automatically invalidate or correct an entry in the CAM storage array upon detecting an error. Also, embodiments that include an error CAM or other circuit for generating a match error signal are also disclosed. These and other features and advantages of the present invention are described in the detailed description below.

BRIEF DESCRIPTION OF THE DRAWINGS

The present invention is illustrated by way of example, and not by way of limitation, in the figures of the accompanying drawings and in which like reference numerals refer to similar elements and in which:

FIG. 17 illustrates the operation of an instruction decoder in a self-invalidation operation;

FIG. 18 illustrates the operation of an instruction decoder in a self-correction operation;

FIG. 29 illustrates an embodiment of the flag logic circuit of FIG. 28;

FIG. 30 illustrates the CAM cell of FIG. 27 according to one embodiment;

FIG. 31 illustrates an embodiment of the multi-ported CAM cell 801 of FIG. 30 in greater detail;

FIG. 32 illustrates a match disable transistor that may be coupled to each match line within the error CAM array of FIG. 27 to prevent a match signal from being asserted on the match line while the corresponding row of CAM cells is being loaded with an error address value;

DETAILED DESCRIPTION

CAM Device

Figure 1:
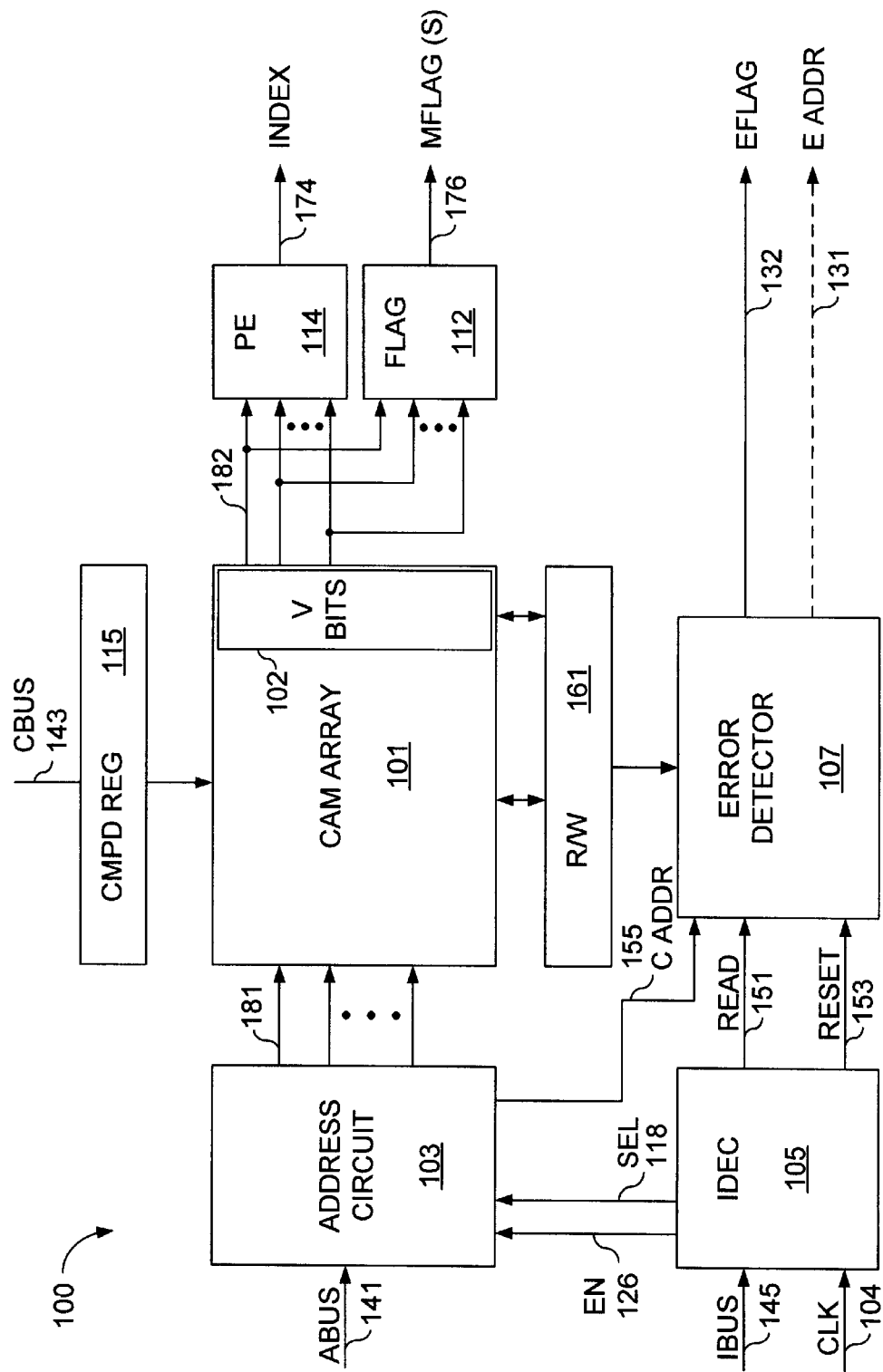
FIG. 1 illustrates a CAM device according to an embodiment of the present invention.

FIG. 1 illustrates a CAM device 100 according to an embodiment of the present invention. The CAM device includes a CAM array 101, address circuit 103, instruction decoder 105, error detector 107, flag circuit 112, priority encoder 114, comparand register 115 and read/write circuit 161. Instructions, addresses and commands are input to the CAM device via an instruction bus (IBUS) 145, address bus (ABUS) 141 and comparand bus (CBUS) 143, respectively. Each of the buses is preferably a multi-conductor signal path coupled to at least one host device, such as a general purpose processor, digital signal processor, network processor, application specific integrated circuit (ASIC) or other instruction issuing device. Also, in alternative embodiments, one or more of the buses may be eliminated and the corresponding signals time-multiplexed onto another of the buses.

The CAM array 101 includes a plurality of CAM cells arranged in rows for storing CAM words. The CAM array also includes a validity storage 102 to store validity values. Each validity value corresponds to a respective row of CAM cells and indicates whether the row contains a valid CAM word. As discussed below, each validity value may be represented by a single bit or multiple bits. The CAM array 101 is coupled to (i.e., connected directly to or through one or more intervening circuits) the address circuit 103, priority encoder 114, flag circuit 112, comparand register 115, and read/write circuit 161. The address circuit 103 is used to select a particular row of the CAM array for read or write access. The read/write circuit 161 is used to sense the output of the selected row during a read operation and to transmit a value to the selected row during a write operation. The comparand register 115 is used to store a comparand value received via the comparand bus 143, and outputs the comparand value to the CAM array 101. In alternative embodiments the comparand register 115 may be omitted and the comparand value input directly to the CAM array 101 from the comparand bus 143. During a compare operation, the comparand may be masked by a global mask value, then compared simultaneously with all the CAM words stored in the CAM array 101. Each of the rows of CAM cells is coupled to a corresponding match line 182, and any match between the comparand and a valid CAM word results in a match signal being output to the priority encoder 114 and flag circuit 112 via the corresponding match line 182. When one or more match signals are asserted on the match lines 182, the priority encoder 114 selects one of the match signals and outputs a CAM index 174 (i.e., address of the CAM word corresponding to the selected match signal). The flag circuit 112 also receives the match signals, and outputs a match flag signal to indicate that a match has occurred. If more than one match signal is asserted, the flag circuit may additionally output a multiple match flag signal to indicate that multiple matches have occurred.

As described below in greater detail, the CAM array 101 is preferably structured to permit read and compare operations to be executed concurrently (i.e., at least partly overlapping in time). Consequently, the CAM array may be read for error checking purposes even when host-requested compare operations are being performed. This provides significant advantages over the prior art error checking technique described above because error checking can effectively be performed in the background, with little or no consumption of compare bandwidth. Moreover, the prior art error checking occurs as part of a host-requested read, meaning that only those CAM array locations selected to be read by the host are error checked. Unless the host is programmed to systematically read all the locations in the CAM array, it is likely that numerous CAM array locations will not be checked. By contrast, in embodiments of the present invention, error checking is performed systematically using an address generator within address circuit 103 to generate a predetermined sequence of error check addresses, thus ensuring that all locations within the CAM array are checked.

Still referring to FIG. 1, the address circuit 103 is used to access the CAM array during read and write operations. Address values (received, for example, via the address bus 141 or from address sources within the CAM device) are decoded to activate corresponding word lines 181. Each word line is coupled to a respective row of CAM cells within the CAM array 101 and enables a CAM word to be output from or input to the array. The instruction decoder 105 outputs a select signal 118 to select the address source used to access the CAM array 101. The instruction decoder also outputs an enable signal 126 to the address circuit 103. The enable signal 126 is used to control generation of error check addresses by a check address generator within the address circuit 103. In one embodiment, the address circuit 103 outputs each check address to the error detector 107.

All instructions to the CAM device, including instructions to load other registers are first received in the instruction decoder 105 via the instruction bus 145. The instruction decoder 105 includes circuitry to decode the incoming instructions as well as control circuitry that responds to the decoded instructions by issuing control and timing signals to other circuit blocks within the CAM device 100. In one embodiment, the instruction decoder 105 is a state machine that transitions from state to state in response to transitions of a clock signal 104 (CLK) and according to status signals received from other circuit blocks within the CAM device 100 and instructions received from the decode circuit 106. For another embodiment, the instruction decoder 105 is a lookup table or read only memory (ROM). The instruction decoder 105 may further include delay circuitry to delay output of timing and control signals to other circuit blocks within the CAM device 100 until appropriate times within a given cycle of the clock signal 104.

The error detector 107 is used to detect errors in CAM words output from the CAM array in error checking operations. The error detector 107 is coupled to receive a CAM word and corresponding validity value from the read/write circuit 161 and to receive the control signals RESET 153 and READ 151 from the instruction decoder 105. Upon detecting an error, the error detector 107 outputs an error address 131 and asserts an error flag signal 132. The error detector 107 receives the check address 155 from the address circuit 103 for error logging purposes, and may optionally output an error address as indicated by dashed line 131. In alternate embodiments, the reset signal 153 and/or read signal 151 may be supplied by an external device (e.g., a host processor) instead of the instruction decoder 105.

Figure 2:
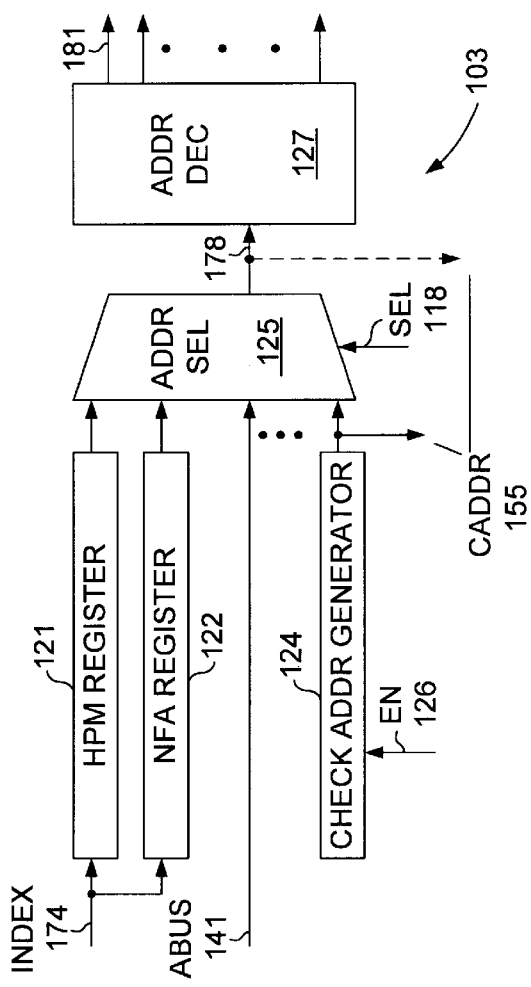
FIG. 2 illustrates an embodiment of the address circuit of FIG. 1 in greater detail.

FIG. 2 illustrates an embodiment of the address circuit 103 of FIG. 1 in greater detail. The address circuit 103 includes an address selector 125 that responds to the select signal 118 from the instruction decoder (i.e., element 105 of FIG. 1) by selecting an address 178 from one of a plurality of address sources. An address decoder 127 decodes the selected address 178 to activate one of a plurality of word lines 181. The address sources include one or more of a highest priority match (HPM) register 121, next free address (NFA) register 122, address bus 141, and check address generator 124. Additional address sources (not shown) may also be provided. The highest priority match (HPM) register 121 is loaded (e.g., under control of the instruction decoder) with a CAM index 174 generated during a compare operation and therefore points to the CAM word that produced the highest priority match in the most recent compare operation. The next free address register 122 is loaded with a CAM index 174 that points to the address of an empty row of CAM cells within the CAM array (i.e., the "next free address"). In one embodiment, the next free address is determined during a write operation based on the state of the validity values within the CAM array. The check address generator 124 is used to generate a sequence of check addresses for error checking purposes. In the embodiment of FIG. 1, the check address generator outputs one check address at a time and advances to the next check address in the sequence in response to the enable signal 126 from the instruction decoder.

The check address 155 may alternatively be output from the check address generator 124 or from the address selector 125. When the check address is output by the address selector 125, any address source, including the check address generator, may be used to supply the check address to the error detector (i.e., element 107 of FIG. 1). For example, a host-requested read operation may be performed at an address supplied via the address bus 141 or at the address indicated by the HPM register 121. In either case, error checking may be performed on the CAM word read out of the CAM array, and the output of the address selector 125 used to provide the check address to the error detector.

Although the HPM register 121, NFA register 122 and check address generator 124 are all shown as being part of the address circuit 103, these circuit blocks may alternatively be disposed elsewhere in the CAM device. For example, in one embodiment, the HPM register is implemented by a field of bits (i.e., to contain the HPM address) within a status register of the CAM device. In such an embodiment, the status register may be selected by the address selector to provide the HPM address for a CAM array access. Contents of the status register, including the HPM address, may also be output from the CAM device in a status read operation.

Still referring to FIG. 2, the check address generator 124 may be loaded to start error checking from a particular address within the CAM array. Also, the check address generator may be start from a known state, for example, upon device power-up or in response to a reset operation.

Figure 3:
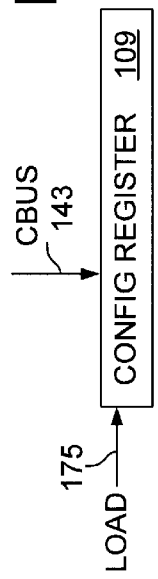
FIG. 3 illustrates a configuration register that may be included within the CAM device of FIG. 1.

FIG. 3 illustrates a configuration register 109 that may be included within the CAM device of FIG. 1 and used to provide configuration information to other circuit blocks within the CAM device. In one embodiment, the configuration register 109 is loaded, in response to a load signal 175 from the instruction decoder, with one or more configuration values received via the comparand bus 143. One or more other signal paths may be used to provide configuration information in alternative embodiments. Connections between the configuration register 109 and other circuit blocks within the CAM device are discussed below in connection with descriptions of specific types of configuration information.

Figure 4:
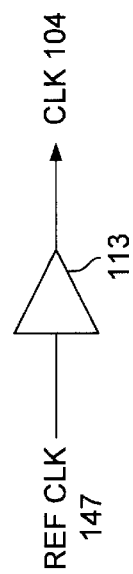
FIG. 4 illustrates a clock circuit that may be used within the CAM device of FIG. 1.

FIG. 4 illustrates a clock circuit 113 that may be used within the CAM device of FIG. 1 to generate the clock signal CLK 104 based on an externally generated reference clock 147. The clock buffer 113 may include circuitry, such as a phase locked loop or delay locked loop, to increase or decrease the frequency of CLK 104 relative to the reference clock 147 and to provide phase offsets as needed to time reception and transmission of signals on the various buses coupled to the CAM device. For simplicity, FIG. 1 shows CLK 104 being supplied only to the instruction decoder 105. In actual implementation, CLK 104 and timing signals derived from CLK 104 may be provided to other circuit blocks within the CAM device 100.

CAM Array

Figure 5:
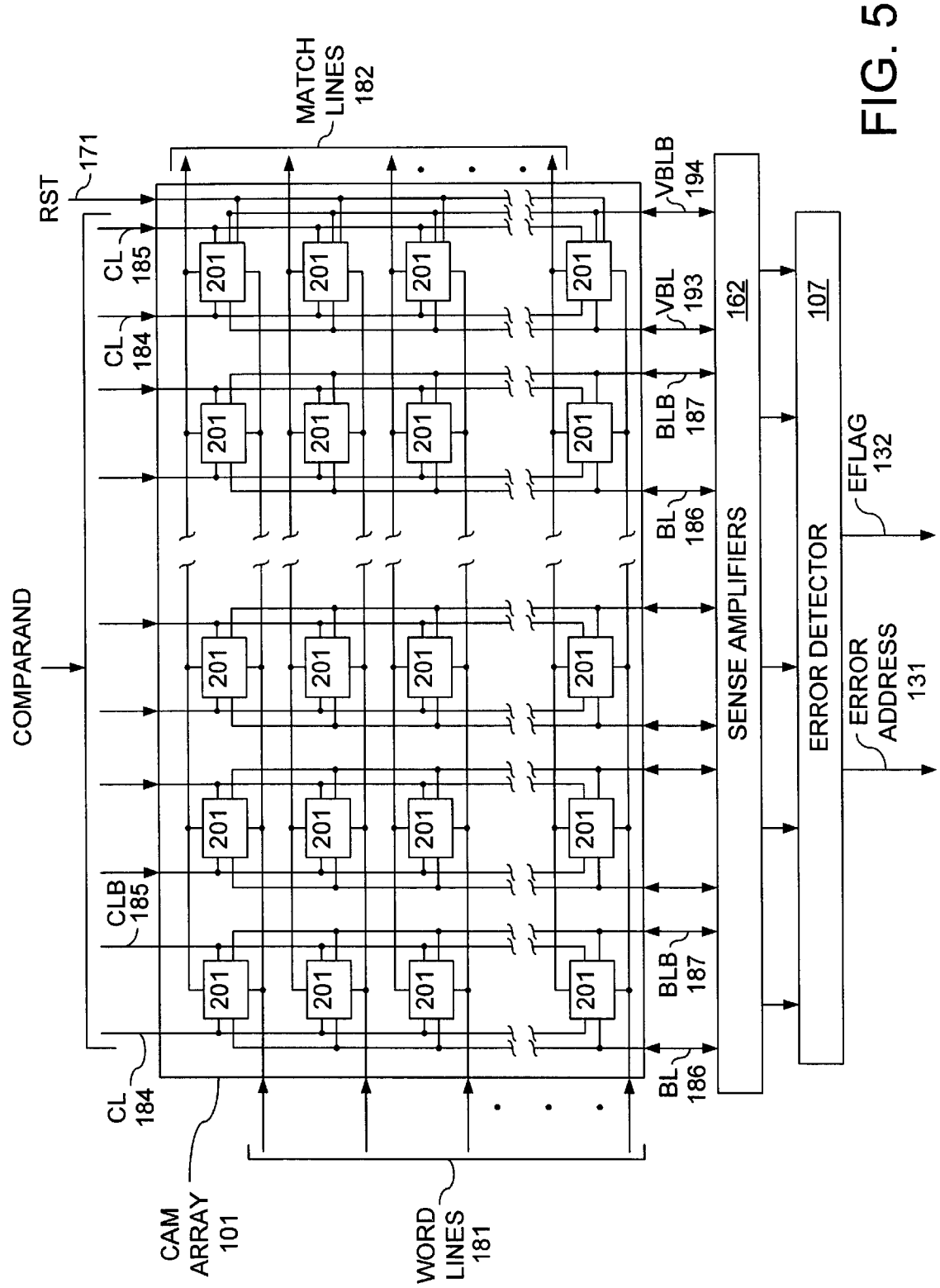
FIG. 5 illustrates the structure of the CAM array of FIG. 1 in greater detail.

FIG. 5 illustrates the structure of the CAM array 101 in greater detail. A plurality of CAM cells 201 are arranged in rows and columns, with each row of CAM cells 201 being coupled to a respective word line 181 and to a respective match line 182. Each of the word lines 181 is coupled to the address circuit 103 of FIG. 1, and each of the match lines 182 is coupled to the priority encoder 114 and the flag circuit 112 of FIG. 1. Each of the CAM cells 201 in a given column is coupled to a pair of bit lines, BL 186 and BLB 187, and to a pair of comparand lines, CL 184 and CLB 185. Each CAM cell 201 preferably includes a memory cell to store at least one binary bit of data, and a compare circuit to compare the content of the memory cell with a comparand signal and its complement presented on the comparand lines CL 184 and CLB 185. Each CAM cell 201 may further include a local mask cell to store a local mask value (such a CAM cell is referred to as a ternary CAM cell). In one embodiment, the memory cell of each CAM cell 201 is a static storage element implemented by back-to-back coupled inverters. In alternative embodiments, different types of storage cells may be used including, without limitation, dynamic storage elements (typically implemented by a single transistor and charge storage element), non-volatile storage elements or any other type of storage element that can be used to store digital data. In the case of a ternary CAM cell, the local mask cell may likewise be implemented using back-to-back coupled inverters or any of the different types of storage cells mentioned above.

During a compare operation, a respective portion of the comparand is applied to each column of CAM cells 201 via lines CL/CLB such that the complete comparand is applied to each row of the CAM cells 201 simultaneously. In one embodiment, each of the match lines 182 is precharged to a high logical level at the start of a comparison operation, but pulled down to a low logical level by the compare circuit within any attached CAM cell 201 that receives comparand signals which do not match the stored data value. In this configuration, any match line 182 not pulled low constitutes a match signal. The match lines 182 are coupled to the flag circuit 112 of FIG. 1 which determines whether any match signals are asserted and, if so, asserts the match flag signal 176. The flag circuit may also assert a multiple match flag signal if more than one match signal is asserted. The match lines 182 are also coupled to the priority encoder 114 of FIG. 1 which determines the highest priority match signal according to a predetermined prioritization policy and outputs an index (i.e., a CAM index) that corresponds to the CAM array location that produced the match signal.

During a read or write access to the CAM array 101, an address of CAM cells to be accessed is supplied to the address decoder 127 of FIG. 2. The address decoder 127 decodes the address to activate the word line 181 that corresponds to the selected row of CAM cells. The activated word line effectively couples the memory cells of the selected row of CAM cells to the bit lines BL/BLB (e.g., by way of pass gates coupled between the memory cells and the bit lines), thereby enabling data to be read out of or written into the selected row. In a write operation, a signal driving circuit (not shown in FIG. 5) within the read/write circuit 161 of FIG. 1 is enabled by the instruction decoder to drive a CAM word or local mask word onto the bit lines BL/BLB (additional bit lines, not shown in FIG. 5, may alternatively be provided to access the local mask cells to store or read a local mask word). The signals present on the bit lines are then latched or otherwise stored in the memory cells in the selected row of CAM cells. During a read operation, the contents of the memory cells (or local mask cells) of the selected row are enabled onto the bit lines BL/BLB where they are sensed by a bank of sense amplifiers 162 within the read/write circuit.

Reflecting on the structure of CAM array 101, it can be seen that providing separate signal paths to the CAM cells 201 for comparand and data values enables data to be output from the CAM array 101 concurrently with a comparand being input into the CAM array 101 for comparison purposes. By this arrangement, a CAM word (or local mask word) may be read from the CAM array for error checking purposes concurrently with performance of a compare operation. As mentioned, this concurrency of comparison and error checking operations provides significant advantages over the prior art technique described above, including the ability to do systematic background error checking with little or no reduction in compare bandwidth.

Still referring to FIG. 5, the CAM array 101 also includes validity storage cells 202 which form the validity storage discussed above in reference to FIG. 1. In one embodiment, the validity storage cells are similar to the CAM cells 201, but include additional circuitry to initialize the validity values to a predetermined state at device power-up. For example, in the case of validity storage cells 202 having volatile memory cells, the validity storage cells 202 preferably include circuitry to force the validity value within each validity storage cell 202 to a reset state in response to a reset signal asserted on line 171, thus indicating that none of the rows of CAM cells 201 include valid CAM words. Thereafter, as CAM words are written to selected rows of CAM cells 201, the validity values within the corresponding validity storage cells 202 are set to indicate storage of valid CAM words.

In one embodiment, each validity value is represented by a single binary bit, called a validity bit. In a first state (i.e., when set), the validity bit indicates that the corresponding row of CAM cells contains a valid CAM word. Conversely, in a second state (i.e., when reset), the validity bit indicates that the corresponding row of CAM cells does not contain a valid CAM word. In alternative embodiments, two or more bits may be used to represent the validity value. For example, in one alternative embodiment, the validity value is formed by a pair of bits: a skip bit and an empty bit. The skip bit indicates that the corresponding row of CAM cells are to be skipped (i.e., ignored) during a compare operation, while the empty bit indicates that no CAM word is stored in the corresponding row of CAM cells. Thus, the skip bit and the empty bit are each reset to indicate that a valid CAM word is stored in the corresponding row of CAM cells. In the interest of clarity, the validity value is described as a validity bit in the remainder of the present description. However, any number of bits may be used to form the validity value in alternative embodiments.

During a compare operation, the validity bits are used to prevent match signal assertion for those rows of CAM cells which do not contain valid CAM words. For example, in the embodiment described above in which the match line is pulled low to signal a mismatch, each reset validity bit prevents assertion of a match signal by pulling the match line low for the corresponding row of CAM cells. Consequently, no match is signaled for rows having reset validity bits regardless of whether the row contents match the comparand. During a read operation, the validity bit is sensed (i.e., via lines 193 and 194) along with the CAM word and forwarded to the error detector 107 where it is used to prevent assertion of the error signal 132 and logging of an error address 131 for invalid CAM words.

Error Detector

Figure 6:
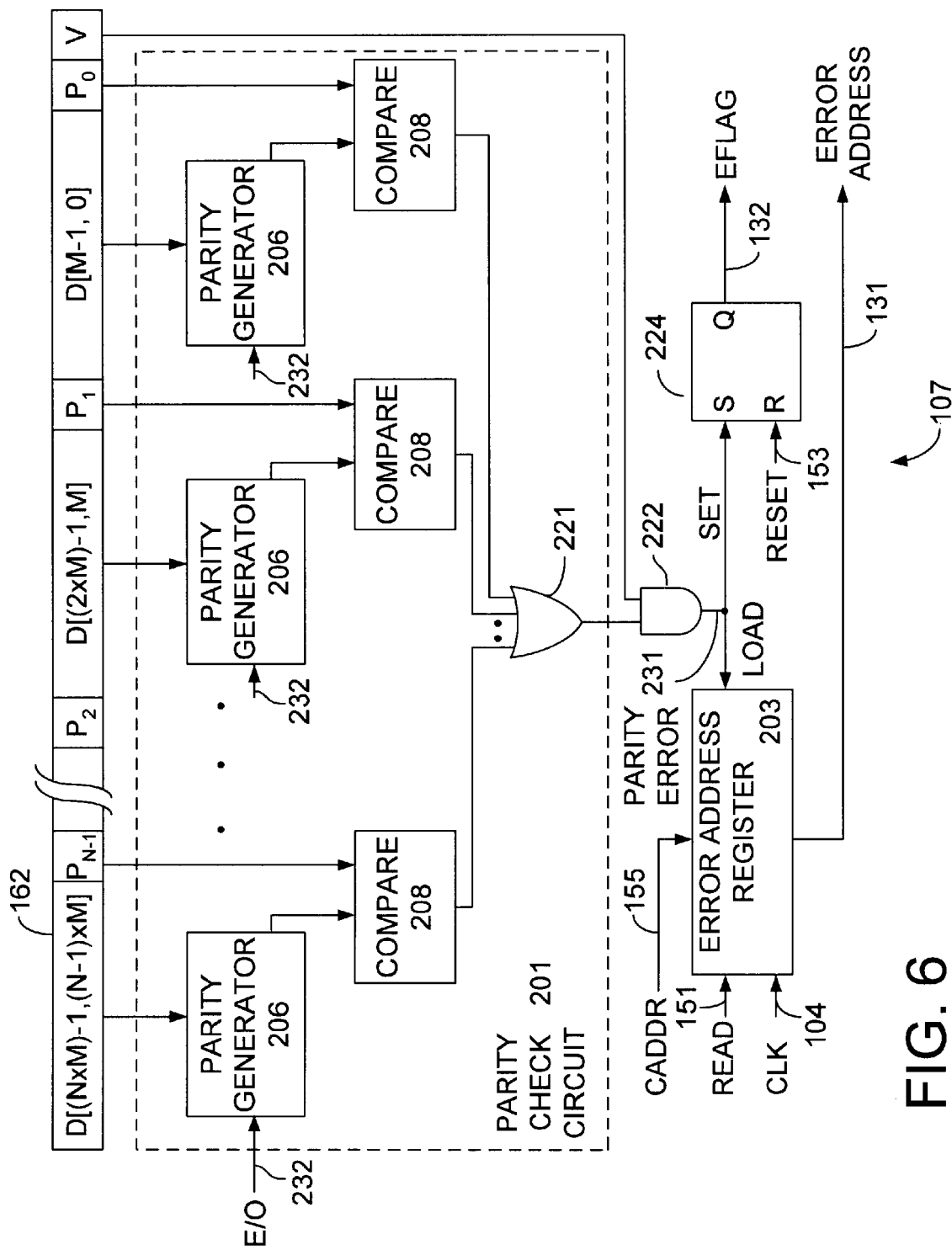
FIG. 6 is a block diagram of an error detector according to a parity checking embodiment.

FIG. 6 is a block diagram of the error detector 107 of FIG. 1 according to a parity checking embodiment. As shown, a CAM word formed by of N groups of M data bits is output from the sense amplifier bank 162. The first group of data bits is designated D[M−1, 0], the second group of data bits is designated D[(2×M)−1, M] and so forth to the final group of data bits designated D[(N×M)−1, (N−1)×M]. The CAM word also includes N parity bits, one for each group of M bits. Although N parity bits are depicted in FIG. 6, any number of parity bits per CAM word may be used in alternative embodiments. For example, a single parity bit may be used for the entire CAM word.

The data and parity bits are input to a parity check circuit 201 that includes a separate parity generator 206 and compare circuit 208 for each group of data bits and its corresponding parity bit. Each parity generator 206 generates a binary output according to the state of an even/odd select signal 232 and the number of set (or reset) data bits within the corresponding group of data bits. For example if the even/odd select signal 232 selects odd parity, circuitry within the parity generator 206 will output a logic '1' if the input group of data bits contains an odd number of logic '1' data bits, and a logic '0' if the group of data bits contains an even number of logic '1' data bits. If the even/odd select signal 232 selects even parity, the output of the parity generator 206 is inverted, i.e., outputting '1' if the input group of data bits contains an even number of logic '1' data bits and a logic '0' if the group of data bits contains an odd number of logic '1' data bits. In alternative embodiments, the logic states may be inverted so that the parity generator 206 outputs a logic '0' if the number of logic '0' data bits is odd or even (in the case of odd parity selection or even parity selection, respectively). Also, the output of the parity generator 206 may be inverted so that, if odd or even parity is selected, the total number of bits in the logic '1' state, including the bit output by the parity generator, is always odd or even, respectively.

Figure 8:
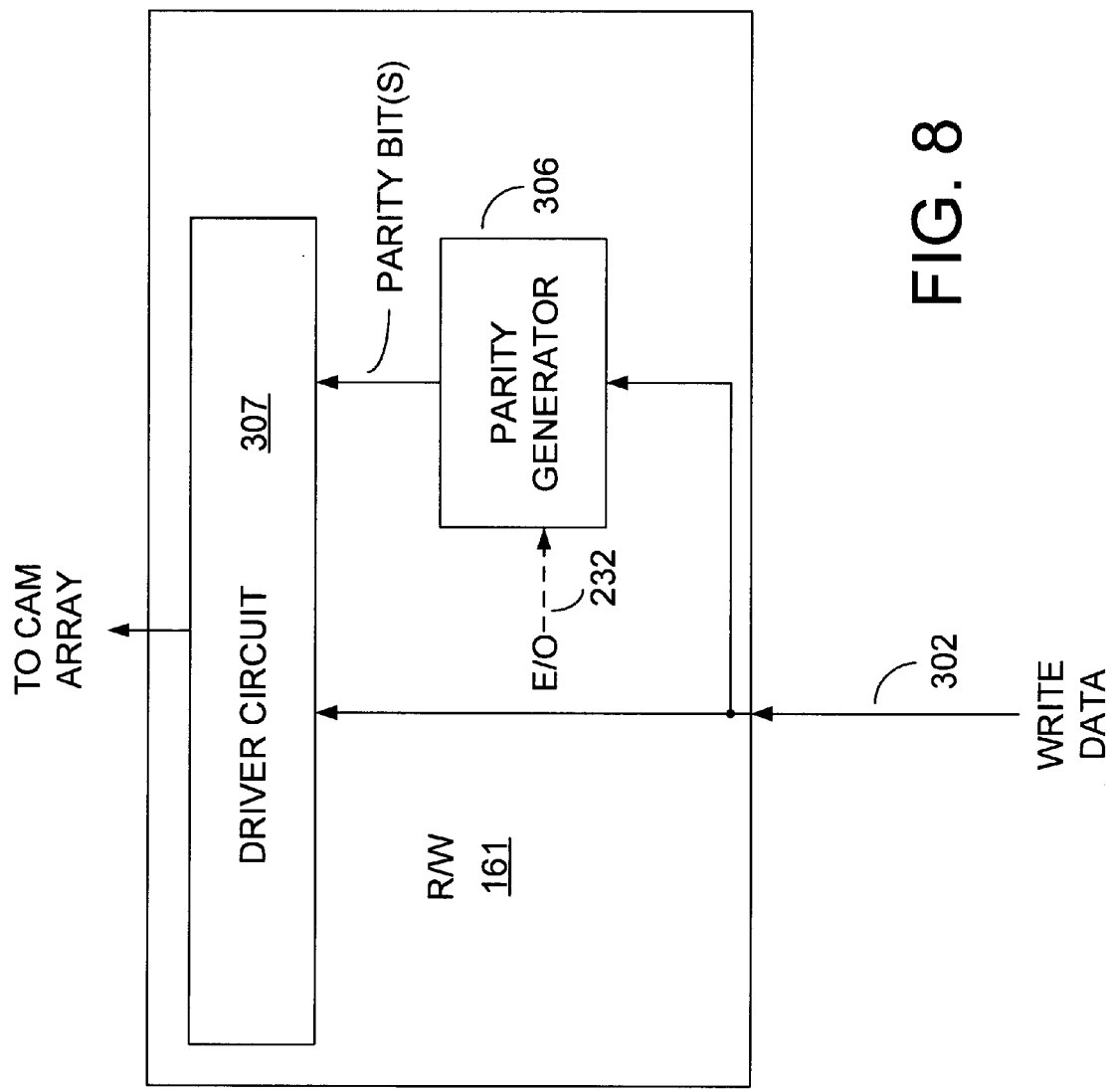
FIG. 8 illustrates a read/write circuit that includes parity generation circuitry.

The parity generator 206 is preferably formed using conventional combinatorial circuitry, for example a combination of exclusive OR gates, to produce a parity result shortly after a CAM word is loaded into the row buffer 162. The even/odd select signal 232 may be output from a configuration register (e.g., element 109 of FIG. 3) according to a configuration value programmed by the host processor. In one embodiment, the parity bits stored in the CAM array are generated by circuitry external to the CAM device (e.g., the host processor), then written to the CAM array along with the corresponding CAM word. Accordingly, such parity bits may be selected to produce either odd or even parity according to the configuration of the external parity bit generator. In that case the even/odd select signal 232 may be programmed by the host to match the parity configuration of the external parity bit generator. In an alternative embodiment, shown in FIG. 8, parity generation circuitry 306 within the read/write circuit 161 (element 161 of FIG. 1) may be coupled to the write data path 302 and used to generate one or more parity bits. The write data and corresponding parity bits are then written into the CAM array by driver circuit 307 during a CAM write operation. The even/odd select signal 232 may be input to the parity generation circuitry 306 or, alternatively, the even/odd select signal 232 may be omitted altogether (i.e., omitted from read/write circuit 161 and error detector 107 of FIG. 6) and the even/odd selection may be hardwired for either even or odd parity generation. In alternative embodiments, parity functions other than even and odd parity may be used. Returning to FIG. 6, the compare circuit 208 compares the output of the parity generator 206 with the corresponding stored parity bit. Compare circuit 208 is preferably a combinatorial logic circuit such as an XOR circuit that outputs a logic '1' only if the stored parity bit and the parity bit generated by the parity generator 206 do not match, but may alternatively be any type of circuit for detecting mismatch between the stored and generated parity bits. The outputs of all the compare circuits 208 are logically ORed in gate 221 so that, if any one of the compare circuits 208 signals a mismatch (i.e., a logical '1'), the parity check circuit 201 will output a logical '1'. For embodiments in which a single parity bit is used for an entire CAM word, OR gate 221 may be omitted. As shown in FIG. 6, the output of the parity check circuit 201 is gated by the validity bit for the CAM word in AND gate 222 to generate a parity error signal 231. That is, even if a parity mismatch is signaled by the parity check circuit 201, the parity error signal 231 will not be asserted by AND gate 222 unless the validity bit for the CAM word being error checked indicates that the CAM word is valid. By this arrangement, parity errors are signaled only for valid CAM words.

The parity error signal 231 is supplied to the set input of an S-R flip-flop and to the load input of an error address register 203. The check address 155 from the check address generator (element 124 of FIG. 2), which constitutes a parity address in this example, is also input to the error address register 203 so that, if the parity error signal 231 is asserted, the parity address is loaded into the error address register 203. As shown in FIG. 6, CLK 104 is input to the error address register 203 to initiate the load operation, but another timing signal may be used to initiate the load operation in an alternative embodiment. As described below, the error address register 203 may be designed to store only a single error address (i.e., address of a location within the CAM array that produced a parity error), or the error address register 203 may be designed to store multiple error address entries. In either case, one entry within the error address register is preferably used to produce the error address signal 131. In the case of a multiple-entry error address register, the read signal 151 may be used to advance the entries in the error address register 203. In the case of a single-entry error address register, the read signal may be omitted.

Still referring to FIG. 6, the S-R flip-flop 224, when set, drives the error flag signal 132. As described above, the error flag signal 132 is preferably output directly to a host device to signal the error condition, but may alternatively (or additionally) be output as part of a status word during a host-requested status read operation. The reset signal 153 is received from the instruction decoder as shown in FIG. 1 and is used to clear the error flag signal by resetting the S-R flip-flop 224.

Figure 22:
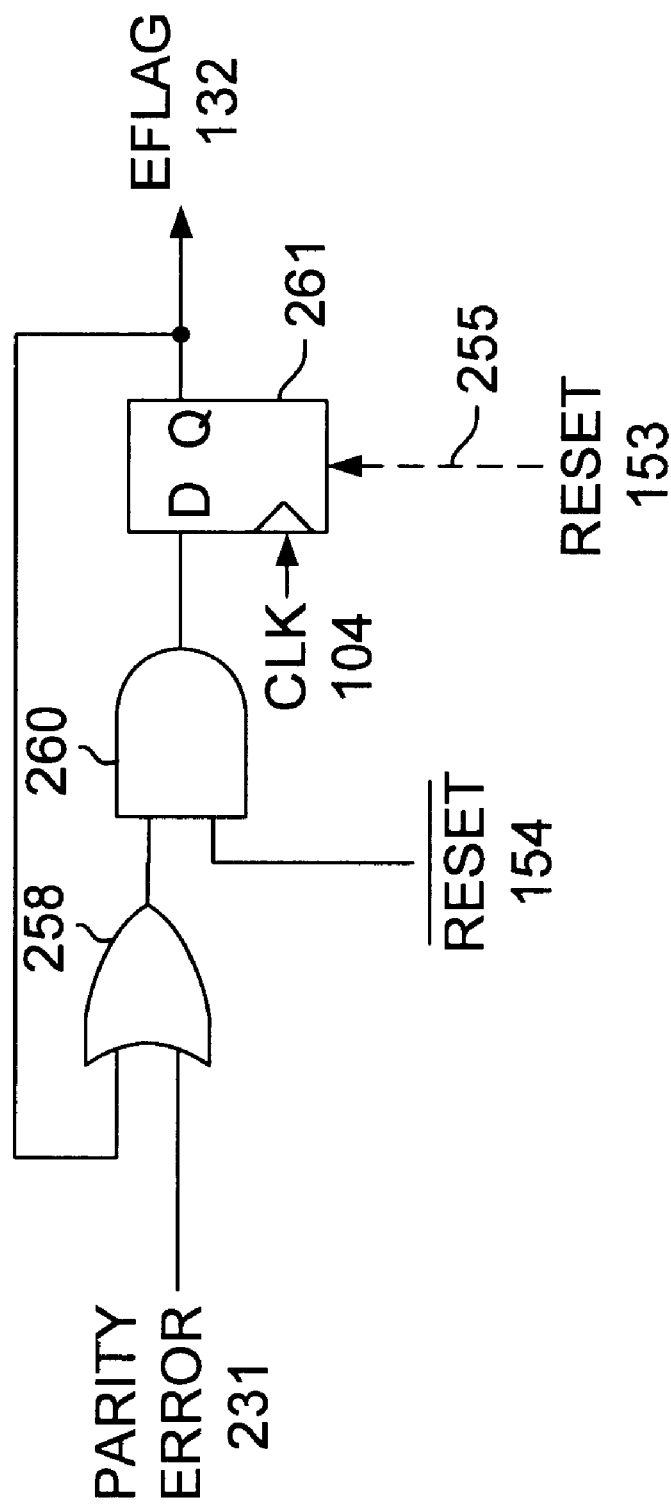
FIG. 22 illustrates a synchronous storage element which set by assertion of a parity error signal.

In alternative embodiments, storage elements other than an S-R flip-flop may be used to register the error condition. For example, FIG. 22 illustrates a synchronous storage element 261 which is set by assertion of the parity error signal 231 during a CLK transition. The output of the synchronous storage element 261, i.e., the error flag signal 132, is logically ORed with the parity error signal 231 in gate 258 so that the error flag signal 132 remains asserted after the parity error signal 231 is deasserted. In one embodiment, the output of the OR gate 258 is ANDed with an active low version of the reset signal 154 in gate 260 before reaching the input of the synchronous storage element. By this arrangement, the error flag signal 132 is reset at any CLK transition in which the active low reset signal 154 is asserted. In an alternative embodiment, the AND gate 260 may be omitted and the reset signal 153 applied to a dedicated reset input of the synchronous storage element 261. This alternative embodiment is depicted by the dashed arrow 255.

Figure 7:
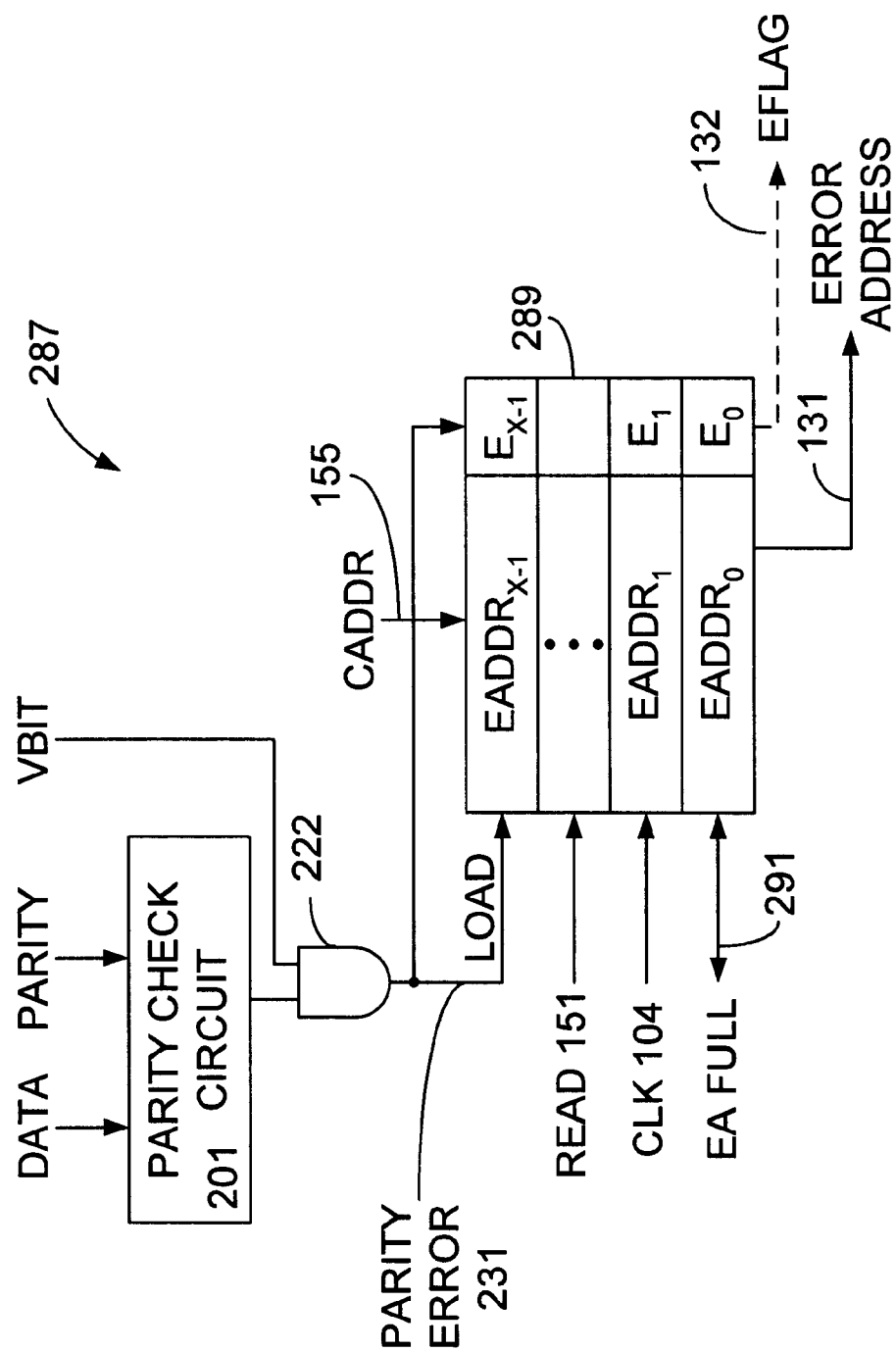
FIG. 7 illustrates an alternative embodiment of an error detector.

FIG. 7 illustrates an alternative embodiment of an error detector 287 in which a multiple-entry error address register 289 is provided and in which a separate error flag value ($E_0$–$E_{X-1}$) is stored along with each error address in the error address register. The multiple-entry error address register 289 preferably operates as a first-in-first-out (FIFO) storage having head and tail entries. The error flag value for the head entry in the FIFO (i.e., $E_0$) is used to produce the error flag signal 132 and the error address value stored in the head entry (i.e., $EADDR_0$) is used to drive the error address signal 131. Accordingly, if the head entry in the FIFO contains an error entry (i.e., error flag value $E_0$ is set), the error flag signal 132 will be asserted and the address of the CAM word containing the error will be present on the error address output 131. Conversely, if the head entry in the FIFO does not contain an error entry ($E_0$ is not set), the error flag signal 132 will not be asserted.

Still referring to FIG. 7, the parity check circuit 201 and logic gate 222 function as described in reference to FIG. 6 to generate a parity error signal 231 if the CAM word under test contains an error and is indicated to be valid by the corresponding validity bit. As shown, the parity error signal 231 is used to signal the error address register 289 to load the check address 155 into a register entry and to set the error flag for the entry. The error address register load operation may be timed by the CLK signal 104 as shown, or by another timing signal.

The read signal 151 is asserted during an error address read operation to advance the contents of the error address register 289. More specifically, when the read signal 151 is asserted, the contents of the error address register 289 are shifted forward so that the entry depicted in FIG. 7 as $EADDR_1/E_1$ becomes the head entry $EADDR_0/E_0$, entry $EADDR_2/E_2$ becomes $EADDR_1/E_1$ and so forth. This entry shifting may be accomplished either by actual shifting of contents from one entry to the next or by shifting of pointers that indicate the head and tail entries within the error address register 289. In the content shifting embodiment, the error flag value for the former tail entry is cleared when the shift is complete to indicate that the entry is free to receive a new error address. In the case of pointer shifting, the error flag value for the former head entry is cleared to indicate that the entry does not contain a valid error address.

The error address register 289 is depicted as having X entries (0 to X−1) available for error address storage. If all X entries of the error address register are filled with valid error addresses, a full signal, EA FULL 291, may be asserted to indicate the full condition. The full signal 291 is preferably provided to the instruction decoder (element 105 of FIG. 1) to stall further error checking until one or more error address read operations are performed to free entries in the error address register 289. The full signal 291 may also be output from the CAM device (e.g., directly or in response to a status read) to signal the full condition to the host processor or other entities external to the CAM device.

Instruction Decoder Operation—Concurrent Instruction Execution and Parity Check

Figure 9:
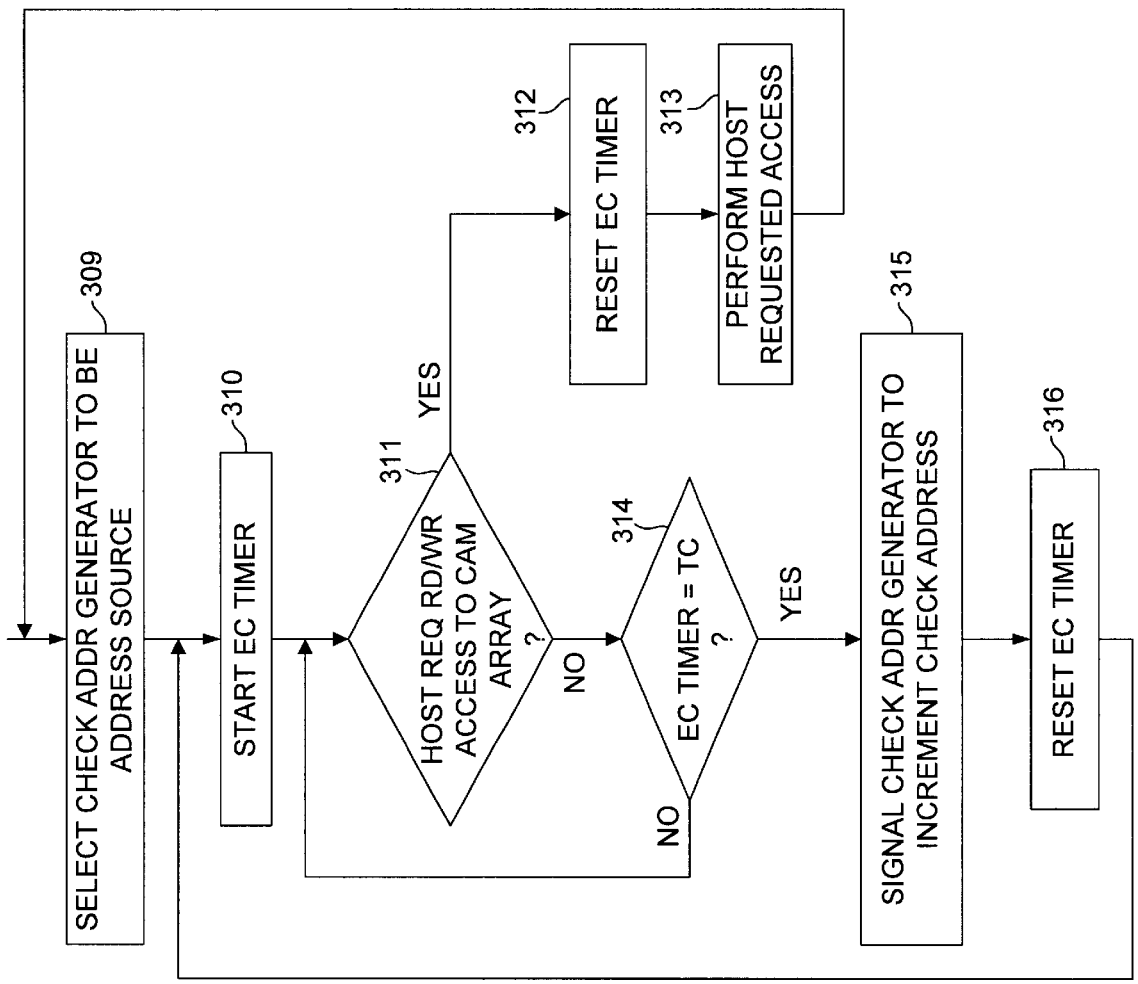
FIG. 9 illustrates the operation of an instruction decoder according to one embodiment.

FIG. 9 illustrates the operation of an instruction decoder (e.g., element 105 of FIG. 1) to control background error checking according to one embodiment. Initially, in block 309, the instruction decoder selects the check address generator to be the address source for a read access to the CAM array. At block 310, the instruction decoder starts an error check timer. In one embodiment, the timer is a counter that counts up or down from an initial value (the reset value) until a predetermined terminal count value is reached, the difference between the initial value and the terminal count corresponding to the time required to complete an error checking operation on the CAM array. During the error check operation, the instruction decoder monitors incoming instructions in decision block 311 to determine whether a host processor has requested read or write access to the CAM array. If so, the instruction decoder resets the error check timer in to the initial value in block 312, then issues the appropriate signals to perform the host requested access in block 313. A predetermined time later (according to the amount of time required to complete the host requested operation), the instruction decoder restarts the error check operation at block 309.

The instruction decoder continues to monitor incoming instructions in decision block 311 until the error check timer has reached the terminal count value (as determined at decision block 314). After the error check timer has reached the terminal count, the instruction decoder signals the check address generator to increment the check address (block 315) and resets the error check timer at block 316, before beginning another error check operation at block 310.

In an alternative embodiment, the error flag signal is provided to the instruction decoder, which selectively enables the check address generator to increment the check address according to whether a parity error is detected. Accordingly, if the error flag signal is determined to be set after decision block 314, the error check operation is completed without signaling the check address generator to increment the check address and further error checking is halted until remedial action is taken (e.g., self-invalidation or self-correction, discussed below, or action by the host). Alternatively, if the error detector includes a multiple-entry error address register, the instruction decoder may signal the check address generator to increment the check address despite error flag signal assertion so long as the error address register is not full. In such an embodiment, a full signal may be output by the error address register to notify the instruction decoder when the error address register is full (i.e., when all entries of the error address register have been loaded with error addresses).

In the embodiment illustrated by FIG. 9, the instruction decoder does not disable the check address generator from incrementing the check address except in response to a host instruction. The host processor may, for example, detect assertion of the error flag signal and issue an instruction to the CAM device to halt further testing until the host processor takes remedial action (e.g., restores a valid CAM word to the CAM array location indicated by the error address).

As mentioned above in reference to FIG. 2, error checking may be performed not only on CAM words selected by the check address generator, but on any CAM word read from the CAM array. For example, performing the host requested access in block 313 may involve reading a CAM word from the array at a host-supplied address (or other address source such as the HPM register), then error checking the CAM word in the manner described above. As discussed in reference to FIG. 2, the check address may be selected by the address selector 125 so that a proper check address may be stored by the error detector regardless of the address source.

Configurable Multi-Block CAM Device

Figure 10:
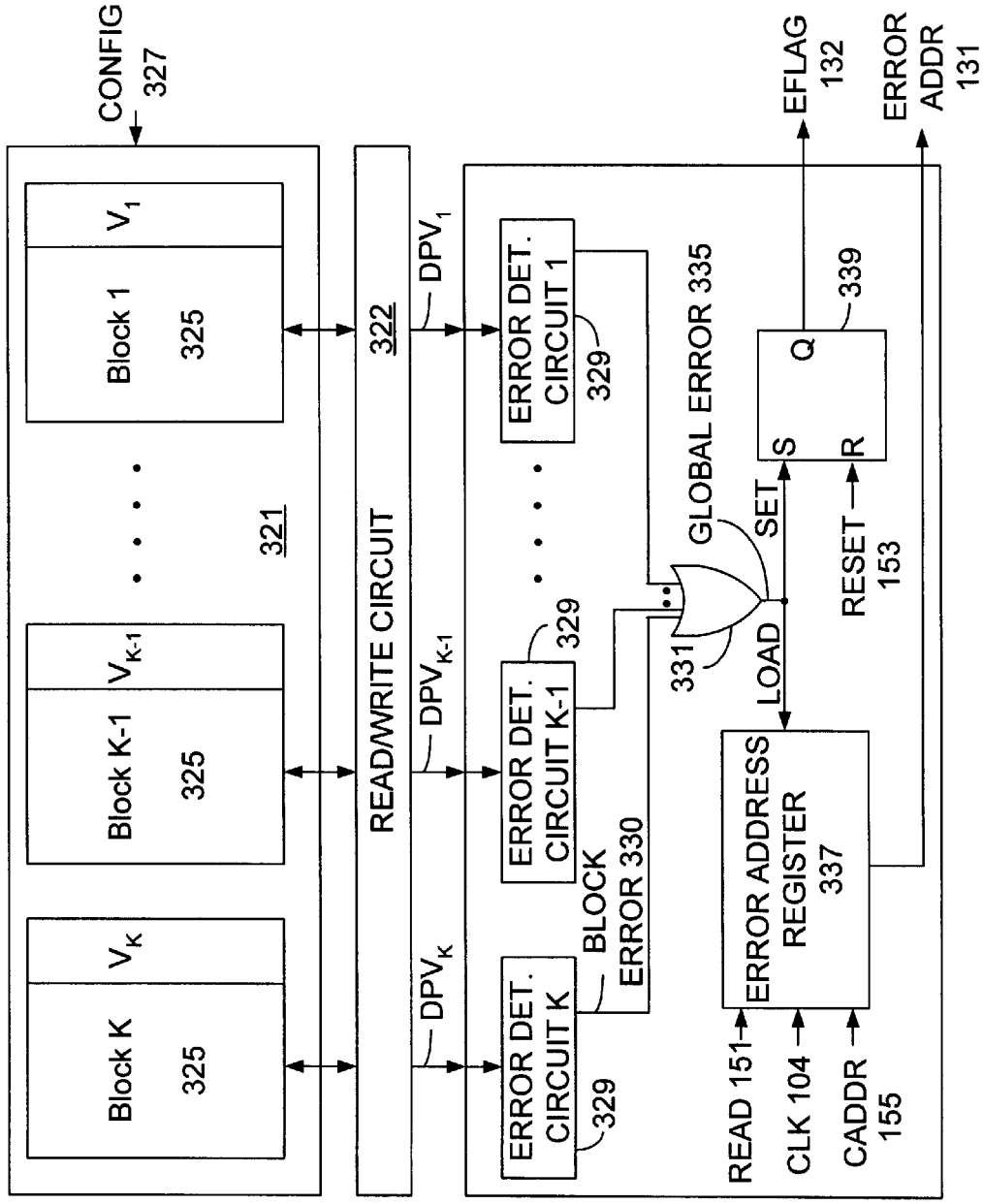
FIG. 10 illustrates the CAM array, read/write circuit and error detector of a CAM device having multiple, configurable storage blocks.

FIG. 10 illustrates the CAM array 321, read/write circuit 322 and error detector 323 of a CAM device having multiple, configurable storage blocks 325. In the embodiment of FIG. 10, each of the storage blocks 325, designated 1 through K, is coupled to the read/write circuit 322 and has a storage width and depth according to a configuration signal, CONFIG 327. In alternative embodiments, the storage width and depth of one or more (or all) of the storage blocks may be fixed and the configuration signal 327 omitted.

Sense amplifier circuitry within the read/write circuit 322 is used to sense a CAM word output from the CAM array 321 during an error check operation as described in reference to FIG. 5. As described below, error check operations may be performed on each of the storage blocks 325 in sequence or concurrently on all the storage blocks 325. In either case, the data, parity and validity values (referred to collectively as a "DPV" value) for the output CAM word is forwarded to an error detection circuit 329 that corresponds to the block containing the CAM word. Each of the error detection circuits, in turn, outputs a parity error signal for its respective block, referred to as a block parity error signal 330. The block parity error signals 330 from the error detection circuits 329 are logically ORed in gate 331 to produce a global parity error signal 335. The global parity error signal 335 is coupled to the load input of the error address register 337 and the set input of the S-R flip flop 339. Accordingly, when a parity error is signaled by any of the error detection circuits 329, the resulting global parity error signal is used to load the check address 155 (e.g., from the check address generator) into the error address register 337 and is used to set S-R flip-flop 339. The error address register 337 and S-R flip flop 339 output the error address 131 and error flag signal 132, respectively, and respond to the read signal 151, CLK 104 and reset signal 153 as described above in reference to FIGS. 3 and 4. As discussed, other circuits may be used to register or latch the error flag signal. Also, the error address register may be a single or multi-entry register and may be implemented according to any of the different embodiments described in reference to FIGS. 3 and 4.

For embodiments that concurrently perform error checking on CAM words from each of the different storage blocks, error detector 323 may include additional circuitry (not shown) to store a value indicative of which of the error detection circuits 329 has signaled a block error 330. This value, referred to as a block identifier, is preferably stored along with the check address 155 within the error address register 337. The block identifier may then be output from the error address register 337 as part of the error address to enable a host or other circuitry within the CAM device to identify the block or blocks within the CAM array 327 that produced the error indication.

Figure 11:
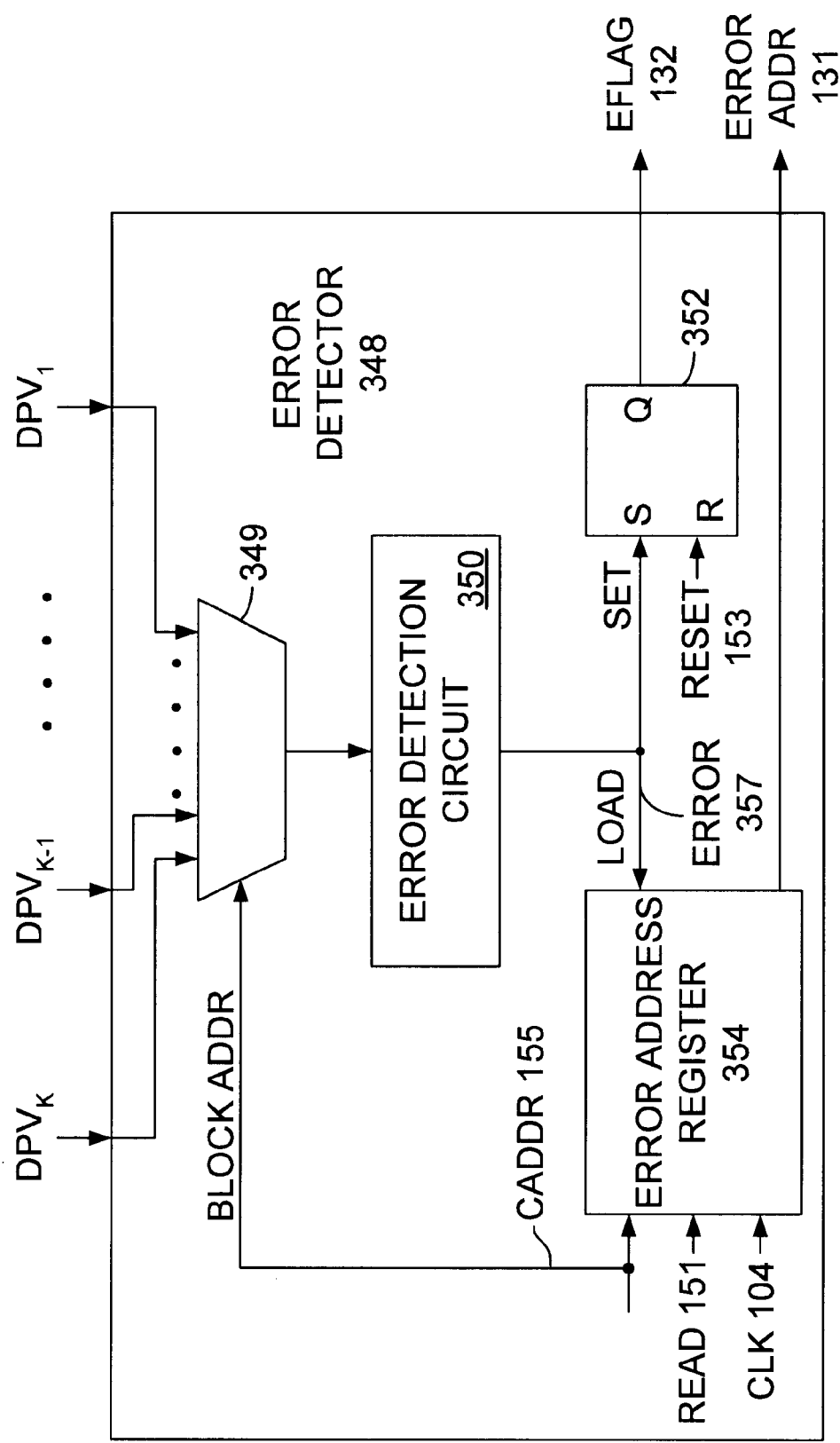
FIG. 11 illustrates an alternate error detector for use with a CAM device having multiple storage blocks.

Although error detector 323 may be used to simultaneously error check a respective CAM word from each of the blocks, the provision of separate error detection circuits for each storage block increases the transistor count and complexity of the error detector implementation. In embodiments of the multiple storage block CAM device that error check one CAM word at a time, the multiple error detection circuits 329 may be omitted in favor of a single error detection circuit that is selectively coupled to the output of each of the storage blocks 325. An error detector 348 having such an alternative arrangement is illustrated in FIG. 11. The DPV values from each of the K storage blocks are coupled to respective inputs of a multiplexer 349. Block address bits from within (or derived from) the check address 155 are supplied to a select input of the multiplexer 349 to select the DPV value from the storage block being error checked. The error detection circuit 350 then generates a error signal 357 in the manner described above, the error signal 357 being used to set the error flag signal 132 (i.e., in S-R flip flop 352 or other storage circuit) and also to signal the error address register 354 to load the check address 155 at the next CLK 104 transition. The read and reset signals (151, 153) operate as described above to advance the entries within the error address register and reset the error flag signal, respectively. Also, the error address register 354 may be a single or multi-entry register and may be implemented according to any of the different embodiments described above.

Configurable Storage Block

Figure 12:
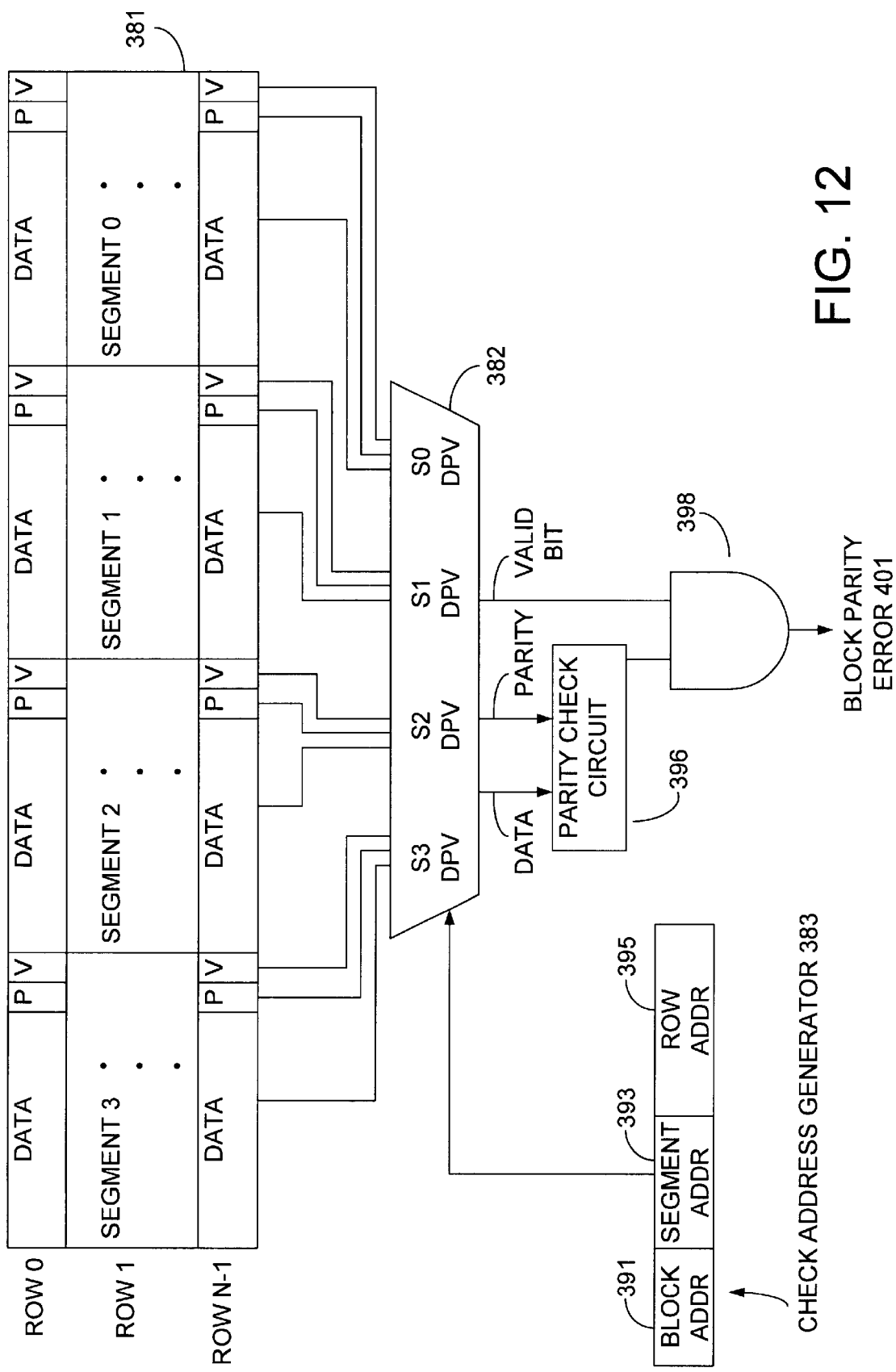
FIG. 12 illustrates the structure of an exemplary configurable storage block that may be used within the CAM array of FIG. 10.

FIG. 12 illustrates the structure of an exemplary configurable storage block 381 that may be used within the CAM array of FIG. 10. As shown, the storage block 381 is organized in four segments (0 to 3, although more or fewer segments may be used) with each segment including N rows of CAM cells (0 to N−1), a parity value and a valid value. As with the CAM cells in embodiments described above, each CAM cell may have any type of storage cell, and may be a ternary CAM cell. The contents of the CAM cells are designated "DATA" in FIG. 12 and may include CAM words and local mask words.

A configuration signal (not shown), for example from configuration register 109 of FIG. 3, is used to determine how the segments are accessed in a host requested read or write operations and, therefore, how CAM words (and local mask values) are stored in the storage block 381. For example, in a first configuration, each segment is used to store N distinct 72-bit CAM words so that the storage dimension of the storage block 381 is 4N×72 bits. This configuration is referred to as a "by one" configuration (×1) to indicate that the CAM word is one segment wide. In a ×2 configuration, each pair of segments (i.e., segment pair 0, 1 and segment pair 2,3) is used to store 144-bit CAM words so that the storage block 381 has a storage dimension of 2N×144 bits. In ×4 configuration, all four segments are used to store 288-bit CAM words so that the storage block 381 has a storage dimension of N×288 bits. It will be appreciated that more or fewer than 72 bits per segment may be provided in alternative embodiments and that numerous other configurations may be achieved in storage blocks having additional segments or different distributions of validity values within the storage block. Also, while a single parity bit per segment is shown in FIG. 12, any number of parity bits may be provided per segment in alternative embodiments (e.g., as shown in FIG. 6).

In the embodiment of FIG. 12, parity checking is performed one segment after another for each segment within the storage block 381, regardless of storage dimension configuration. In such an embodiment, the check address generator 383 preferably generates a check address having three components: a block address component 391 to select the storage block to be parity checked, a segment address component 393 to select the segment to be parity checked within the selected storage block, and a row address component 395 to select a row within the selected segment of the selected bock (note that the check address may be a single value, with the block, segment and row address components being represented by selected bits within the check address). The segment address component 393 of the check address is input to the multiplexer 382 to select the appropriate DPV value from the storage block 381. The data and parity values are supplied to a parity check circuit 396 to determine whether there is a parity mismatch. The output of the parity check circuit 396 is gated by the validity bit in AND gate 398 to produce a block parity error signal 401. The block parity error signal 401 may then be logically ORed with block parity error signals from other blocks to produce a global parity error signal as shown in FIG. 10. Also, though not shown in FIG. 12, the multiplexer 382 may be extended (or a second multiplexer provided) to allow selection of a DPV value from a selected segment (indicated by the segment address component of the parity address) from a selected block (indicated by the block address component of the parity address) for input to a single error detection circuit as shown in FIG. 11.

Figure 13:
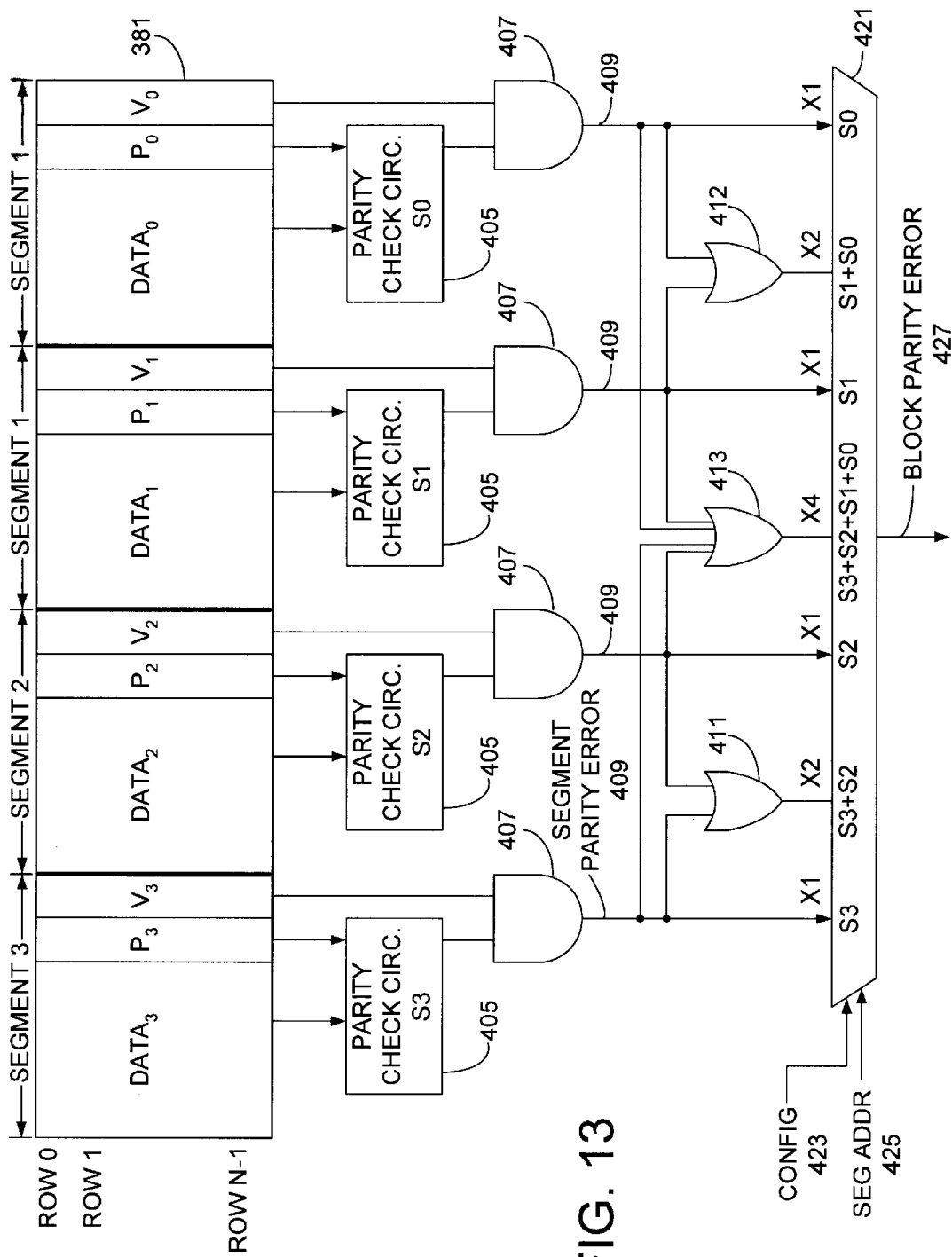
FIG. 13 illustrates a circuit for generating a block parity error signal.

FIG. 13 illustrates a circuit for generating a block parity error signal 427 through concurrent parity checking of complete CAM words regardless of whether the storage block 381 is configured to store a ×1, ×2 or ×4 CAM word. As shown, four distinct parity check circuits 405 are coupled respectively to receive the data and parity values from the four segments of the storage block 381 (more or fewer parity check circuits 405 may be provided according to the number of storage block segments). The output of each parity check circuit is ANDed in a respective logic gate 407 with the validity bit from the corresponding segment to produce a segment parity error signal 409. The four segment parity error signals 409 are input individually and in logical combinations with one another to multiplexer 421 The logical combinations to include: (1) ORing the segment 3 parity error signal with the segment 2 parity error signal in OR gate 411 to produce a ×2 parity error signal indicative of whether a ×2 CAM word spanning segments 2 and 3 has a parity error; 2) ORing the segment 1 parity error signal with the segment 0 parity error signal in OR gate 412 to produce a ×2 parity error signal indicative of whether a ×2 CAM word spanning segments 0 and 1 has a parity error; and 3) ORing all the segment parity error signals in OR gate 413 to produce a ×4 parity error signal indicative of whether a CAM word spanning all four segments has a parity error. Additional combinations of segment parity error signals 409 may be provided in alternative embodiments.

Still referring to FIG. 13, the multiplexer 427 is responsive to a configuration signal 423 (e.g., from the configuration register 109 of FIG. 3), and a segment address 425 (e.g., from the check address generator) to select one of the individual segment parity error signals 409 or one of the logical combinations of segment parity error signals (i.e., ×2 or ×4 parity error signals) to drive the block parity error signal 427. For example, if the configuration signal 423 indicates a ×1 configuration, then the segment address 425 is used to select one of the four segment parity error signals 409 to drive the block parity error signal 427. If the configuration signal 423 indicates a ×2 configuration, then the segment address 425 is used to select between the two ×2 parity error signals output from OR gates 411 and 412 to drive the block parity error signal 427. If the configuration signal 423 indicates a ×4 configuration, the ×4 parity error signal output from OR gate 413 is selected to drive the block parity error signal 427.

The circuit of FIG. 13 may be modified such that, for the ×2 and ×4 parity error signals, the outputs of the participating parity check circuits 405 are first logically ORed with one another and then ANDed with a logical OR combination of corresponding validity bits. By this arrangement, only one of the two validity bits for a ×2 CAM word needs to be set to perform a complete parity check of the CAM word. A similar logical OR combination of all four parity check circuit outputs may be ANDed with a logical OR combination of all four validity bits to produce the ×4 parity error signal. The Boolean expressions for such an arrangement are as follows:

$$\times 2(S0+S1)=(PCC0+PCC1)*(V0+V1)$$

$$\times 2(S2+S3)=(PCC2+PCC3)*(V2+V3)$$

$$\times 4=(PCC0+PCC1+PCC2+PCC3)*(V0+V1+V2+V3),$$

where the '+' symbol represents a logical OR operation, the '*' symbol represents a logical AND operation, V signifies a validity bit and PCC signifies a parity check circuit output.

The circuit of FIG. 13 may alternatively be modified to require that all the validity bits for a given ×2 or ×4 CAM word be set in order for an error to be signaled. The Boolean expressions for such an arrangement are as follows:

$$\times 2(S0+S1)=(PCC0+PCC1)*V0*V1$$

$$\times 2(S2+S3)=(PCC2+PCC3)*V2*V3$$

$$\times 4=(PCC0+PCC1+PCC2+PCC3)*V0*V1*V2*V3$$

Other logical constructs for generating ×2 and ×4 parity error signals may be used without departing from the scope of the present invention. Also, numerous additional logical constructs may be used to generate multi-segment parity error signals for a storage block having additional segments or different distributions of validity bits within the storage block.

Still referring to FIG. 13, in an alternative embodiment a row of CAM cells spanning all four segments of the CAM block 381 may be concurrently error checked without regard to the width and depth configuration of the block. In such an embodiment, the multiplexer 421 and logic gates 411 and 412 may be omitted, and the OR gate 413 used to generate the block parity error.

CAM Device With Self-Invalidating Function

Figure 14:
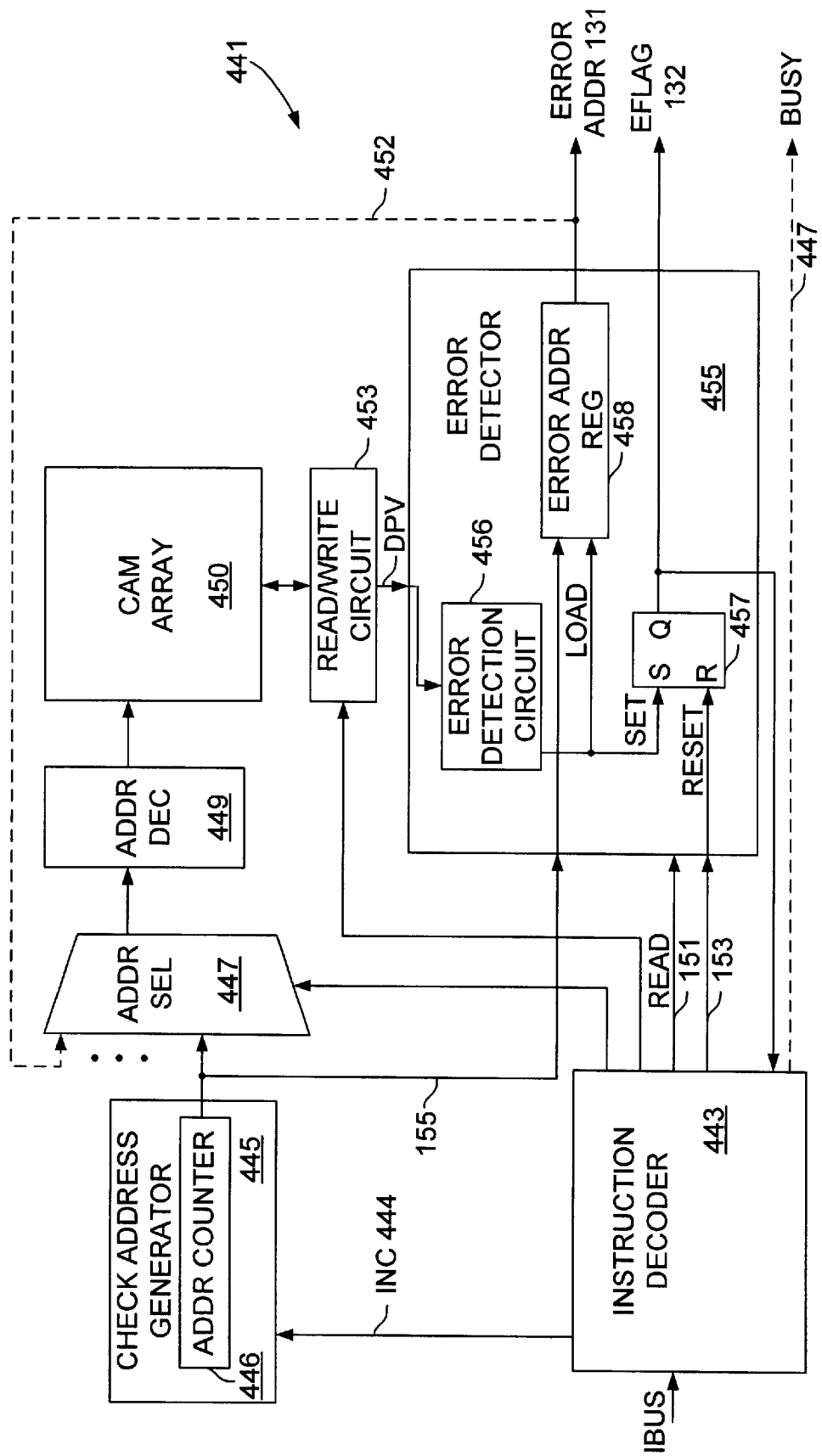
FIG. 14 is a block diagram of a CAM device capable of automatically invalidating a CAM word upon detection of a parity error.

FIG. 14 is a block diagram of a CAM device 441 capable of automatically invalidating a CAM word upon detection of an error. The CAM device 441, referred to as a self-invalidating CAM, includes an instruction decoder 443, check address generator 445, address selector 447, address decoder 449, CAM array 450, read write circuit 453 and error detector 455. Numerous other circuit blocks may be included in the CAM device 441, including circuit blocks shown in the CAM device of FIG. 1, but have been omitted from FIG. 14 in the interest of clarity. The instruction decoder 443, check address generator 445, address selector 447, address decoder 449, CAM array 450, read/write circuit 453 and error detector 455 operate generally in the manner described in reference to the preceding figures (e.g., instruction decoder 105 of FIG. 1; check address generator 124 of FIG. 2; address selector 125 of FIG. 2; address decoder 127 of FIG. 2; CAM array 101 of FIGS. 1 and 5; read/write circuit 161 of FIGS. 1 and 8, and read/write circuit 322 of FIG. 10; and error detector 107 of FIGS. 1, 5, and 6, error detector 287 of FIG. 7, error detector 323 of FIG. 10, and error detector 348 of FIG. 11). More specifically, if the error detection circuit 456 detects a parity error in the CAM word selected for error checking by the check address generator 445, the error flag signal 132 is asserted (e.g., by S-R flip flop 457 or other storage element) and the error address register 458 is loaded with the check address 155. The entries within the error address register 458 are advanced in response to a read signal 151 from the instruction decoder 443 and the error flag signal is deasserted in response to a reset signal 153 from the instruction decoder 443.

As shown, the instruction decoder 443 is coupled to the output of the S-R flip flop 457 and therefore is signaled upon detection of a parity error. If no parity error is signaled, the instruction decoder 443 issues an increment signal 444 to the check address generator 445 which responds by incrementing a counter 446 containing the parity address. If a parity error is signaled, the instruction decoder 443 does not issue the increment signal 444 to the check address generator 445 and the address counter 446 remains pointed at the CAM word which produced the parity error.

FIG. 17 illustrates the operation of the instruction decoder 443 (FIG. 14) in a self-invalidation operation. Starting at decision block 475, the instruction decoder monitors the reception of instructions via the IBUS to determine if any no-operation (no-op) instructions are received or if any idle intervals (i.e., no instruction transmission by the host) occur. If instructions requiring read, write or compare operations on the CAM array are received, the instructions are executed as indicated by block 477. On the other hand, if a no-op instruction (or idle interval) is detected at decision block 475, the instruction decoder evaluates the error flag signal at block 479 to determine if the error detector has detected an error in the CAM array. If the error flag is not set, the instruction decoder returns to monitoring the incoming instructions for no-ops and idle intervals. If the error flag is set, then at block 481 the instruction decoder signals the address selector to select the check address generator as the address source for a CAM array access. At block 483 the instruction decoder signals the write circuit to clear the validity bit for the CAM word selected by the address decoder, thereby invalidating the CAM word. The validity bit may be cleared, for example, by a write to the selected CAM word (including the validity bit), or by signaling the validity storage within the CAM array to reset the validity bit for the selected CAM word. Once the validity bit for the CAM word is reset, the CAM word may no longer produce a match result during a compare operation. Accordingly, by performing the self-invalidation operation, false matches due to the corrupted CAM word may be prevented.

Depending on the amount of time required to perform the self-invalidation operation, it may be desirable for the instruction decoder to issue a busy signal (illustrated in FIG. 14 by dashed line 447) to the host processor during a self-invalidation operation to prevent the host processor from issuing instructions that will result in a resource conflict within the CAM device 441 (e.g., host instructions that require read, write or compare operations to be performed on the CAM array). Alternatively, a self-invalidation operation may be aborted to perform a host requested operation in the event of a resource conflict.

Although a self-invalidation operation has been described, the instruction decoder 443 of FIG. 14 may also invalidate a corrupted CAM word in response to an explicit host instruction. In that case, the sequence of operations may similar to those shown in FIG. 17 (i.e., blocks 481 and 483) followed by a signal to the error detector 455 to reset the error flag 132.

Still referring to FIG. 14, if the error address register 458 is a multiple-entry error address register, it may be desirable to access the CAM array (in a self-invalidation operation) using the error address 131 instead of the check address 155. A signal path for this purpose is shown by dashed line 452 in FIG. 14. In this alternative configuration, the error address register may be advanced (e.g., by issuance of read signal 151) after each self-invalidation operation to step through the error addresses logged in the error address register 458. Accordingly, the CAM word for each entry in the error address register 458 may be invalidated in a separate invalidation operation until the error address register is emptied.

Figure 15:
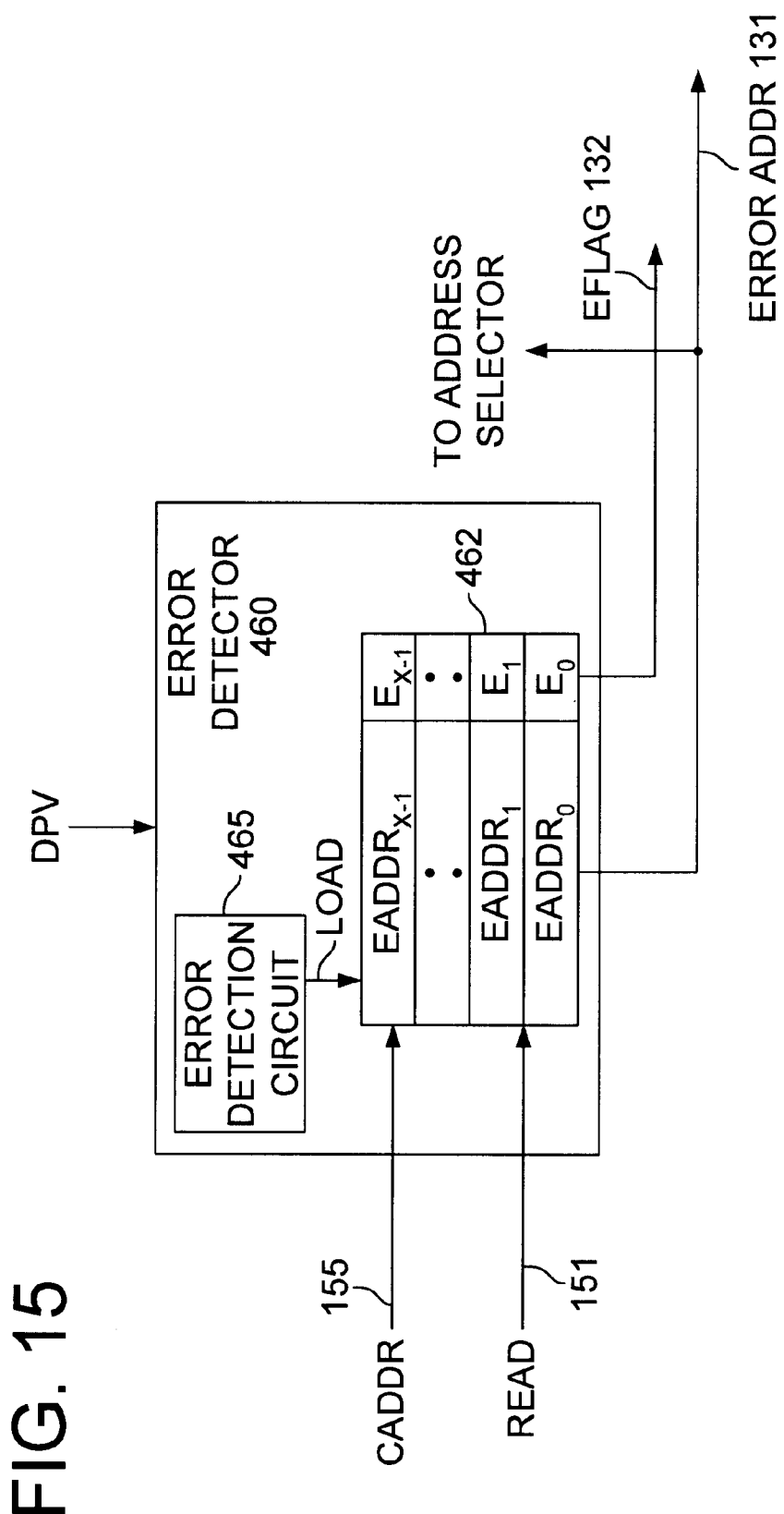
FIG. 15 illustrates an error detector that includes a multiple-entry error address register to support self-invalidation.

FIG. 15 illustrates an error detector 460 that includes a multiple-entry error address register to support self-invalidation. The error detector is similar to the error detector 455 in FIG. 14, except that, in response to a load signal from the error detection circuit 465, an error flag is stored in the error register 462 along with the corresponding check address 155. The error flags are designated $E_0$ to $E_{X-1}$ in FIG. 15. As the entries in the error address register 462 are advanced (e.g., in response to read signal 151) the error flag associated with the new head entry in the error address register 462 is used to provide the error flag signal 132, and the error address at the head entry is used to provide the error address output 131. By this arrangement, the instruction decoder may step through the error address register entries in a sequence of self-invalidation operations until an entry having a reset error flag is reached, signifying that the error address register 462 has been emptied.

In many CAM applications, a backup storage of the CAM array content is maintained to allow the CAM array to be restored in the event of memory loss or corruption. In such applications, self-invalidation of a CAM word may result in loss of coherency (i.e., sameness) between the CAM array and the backup storage. Accordingly, it may be desirable to provide an alternate error storage within a CAM device so that, as the CAM device performs self-invalidation operations to clear errors in the error address register, those same errors remain logged in the alternate error storage. The host may then access the alternate error storage from time to time to determine whether errors have occurred and, if so, take appropriate actions to maintain coherency between the CAM array and the backup storage, and restore any invalidated CAM words. In one embodiment, the alternate storage is substantially identical to the error address register (and loaded at the same time) except that a self-invalidate indicator is included in each entry. The self-invalidate indicator is initially reset when an error is logged, but then set if an invalidate operation takes place at the logged error address. In an alternate embodiment, no such self-invalidate indicator is maintained.

Error Correction Code—CAM Device With Self-Correcting Function

Figure 16:
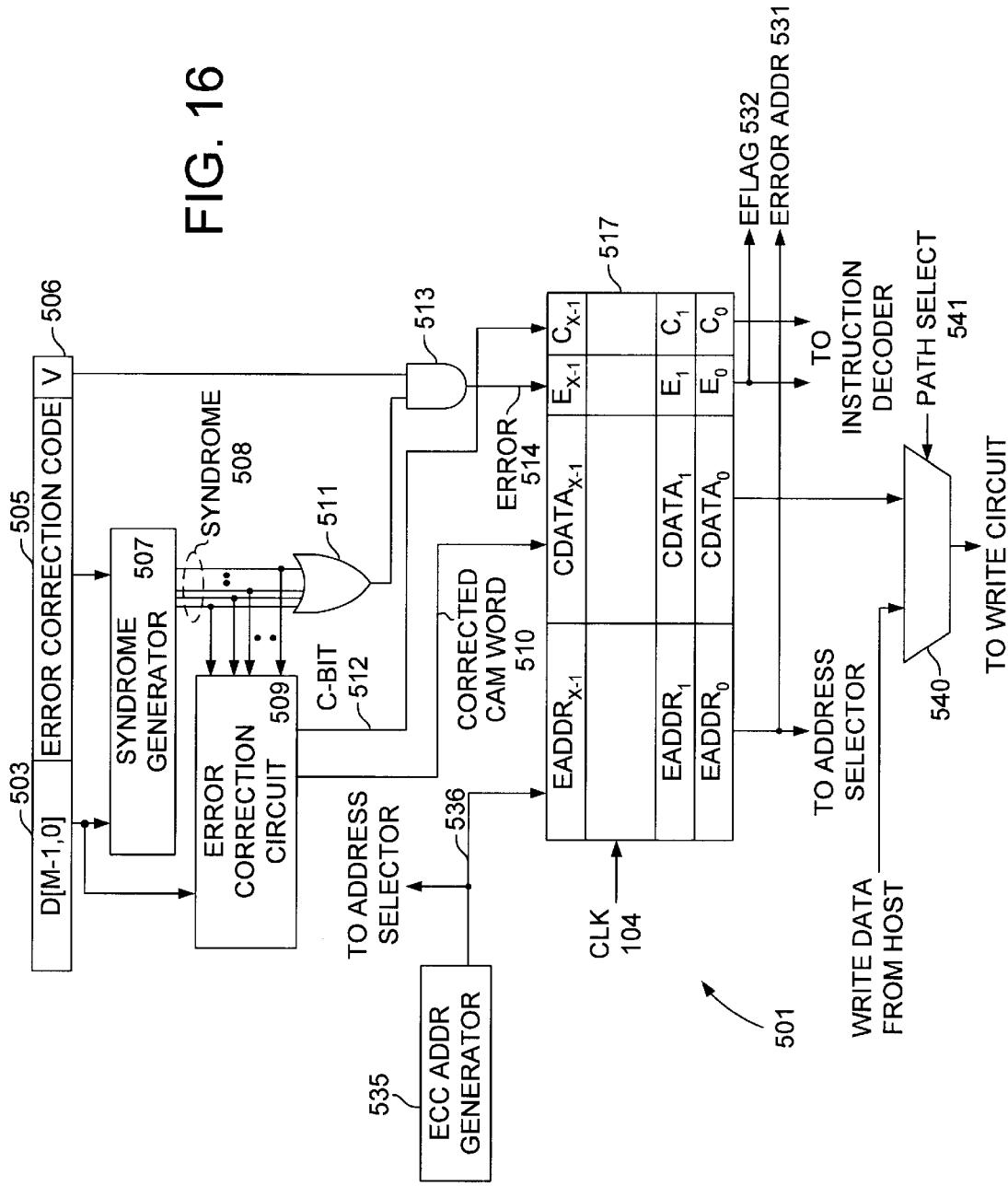
FIG. 16 illustrates an alternative error detector 501 that operates on an error correction code instead of a parity bit.

Thus far, error checking has been described primarily in terms of parity checking. FIG. 16 illustrates an alternative error detector 501 that operates on an error correction code stored with the CAM word instead of a parity bit. Error correction codes (e.g., Hamming codes) are sequences of bits formed, for example, by generating parity values for overlapping groups of bits within the CAM word. The chief advantage of error correction codes (ECCs) is that they permit location and therefore correction of a single bit error within a data value. ECCs also permit detection of two-bit errors within a data value; errors that typically will not be detected by a parity-checking scheme because the two errors cancel one another insofar as they contribute to the even/odd parity of the data value.

As shown in FIG. 16, a CAM word 503 and corresponding ECC 505, which together form a codeword, are supplied to a circuit called a syndrome generator 507. The syndrome generator 507 effectively multiplies the codeword with a parity check matrix (e.g., a Hamming matrix) to generate a parity check vector called a syndrome 508. In one embodiment, any nonzero bit in the syndrome 508 indicates that an error has occurred. Accordingly, the individual bits of the syndrome 508 are logically ORed in gate 511 to determine if the CAM word 503 has an error. The output of OR gate 511 is then gated by the validity bit 506 for the CAM word 503 in AND gate 513 to generate an error signal 514. The error signal 514 is applied to the load input of an error address register 517 to cause the error address register 517 to be loaded with an error address 536 at the next transition of CLK 104. An ECC address generator 535 is used to address the CAM array for error detection purposes and also to supply the error address 536 to the error address register 517.

The syndrome 508 is additionally supplied to an error correction circuit 509 along with the CAM word 503. If the syndrome is nonzero (indicating an error), and a single bit error has occurred, the error correction circuit 509 generates a corrected CAM word 510. In one embodiment, the corrected CAM word 510 is generated by identifying a column of bits in the parity check matrix that matches the bit pattern of the syndrome 508. The position of the matching column within the parity check matrix (i.e., first column, second column, etc.) corresponds to the position of the bit in error within the CAM word 503. The bit in error is then to flipped (i.e., inverted) by the error correction circuit 509 to produce the corrected CAM word 510. As shown in FIG. 16, the corrected CAM word 510 is supplied to the error address register 517 for storage in a corrected data array (CDATA).

If the syndrome 508 does not match one of the columns of the parity check matrix corresponding to a single bit error, a multi-bit error has occurred and CAM word output from the error correction circuit 509 is not a corrected CAM word. Accordingly, a signal to indicate whether the CAM word 503 has been corrected, called a C bit 512, is output from the error correction circuit 509 along with the CAM word 510. If a single-bit error has been detected and corrected, the C bit 512 is set to indicate that the CAM word 510 has been error corrected by the error correction circuit 509. If a multi-bit error has been detected, the C bit 512 is reset to indicate that the CAM word 510 has not been error corrected. In the embodiment of FIG. 16, the C bit 512 is loaded into the error address register 517 along with the CAM word 510, the error signal 514 and the error address 536.

Still referring to FIG. 16, the error bit and error address in the head entry of the error address register 517 are used to produce the error address 531 and error flag signal 532. These signals may be used to support background error checking and self-invalidation operations as described above. The storage of the corrected CAM words 510 and C bits 512 further enables a CAM device to perform a self-correction operation in which a corrupted CAM word within the CAM array is overwritten with a corrected CAM word from the error address register 517. More specifically, a write data multiplexer 540 is provided to select, in response to a path select signal 541 from the instruction decoder, either host-supplied data or a corrected CAM word from the error address register to be supplied to the write circuit. Also, the C bit at the head entry of the error address register 517 is provided to the instruction decoder to notify the instruction decoder that a corrected CAM word is available for use in a self-correction operation. In a self-correction operation, the write data multiplexer 540 outputs a corrected CAM word to the write circuit and the error address 531 is supplied to the address selector (not shown) to address the appropriate entry within the CAM array.

FIG. 18 illustrates the operation of an instruction decoder in a self-correction operation. As with the self-invalidation operation, the instruction decoder monitors incoming host instructions in decision block 570 to determine whether a no-op instruction is received or if any idle intervals occur. If instructions requiring read, write or compare operations on the CAM array are received, the instructions are executed as indicated by block 572. If a no-op instruction (or idle interval) is detected at decision block 570, the instruction decoder evaluates the error flag signal at block 574 to determine if the error detector has detected an error in the CAM array. If the error flag is not set, the instruction decoder returns to decision block 570 to monitor the incoming instructions for no-ops and idle intervals. If the error flag is set, then at block 576 the instruction decoder signals the address selector to select the error address output by the error address register as the address source for a CAM array access. If the instruction decoder determines the C bit to be set at decision block 578, the instruction decoder signals the write data multiplexer at block 580 to select the error address register to supply a corrected CAM word for a write operation. Subsequently, at block 582, the instruction decoder signals the write circuit to write the corrected CAM word to the CAM array at the error address. Finally, at block 584, the instruction decoder signals the error address register to advance to the next entry. Returning to decision block 578, if the C bit is not set, the instruction decoder may perform a self-invalidate operation prior to signaling the error address register to advance. For example, as shown in block 586, the instruction decoder may signal the write circuit to clear the validity bit for the CAM word indicated by the error address, thereby invalidating the CAM word within the CAM array.

As with the self-invalidation operation, it may be desirable for the instruction decoder to issue a busy signal to the host processor during a self-correction operation to prevent the host processor from issuing instructions that may result in a resource conflict within the CAM array (e.g., host instructions that require read, write or compare operations to be performed on the CAM array). This signal is indicated by dashed line 447 in FIG. 14. Also, as with the self-invalidation operation, the self-correction operation may be aborted to avoid delaying execution of host instructions. Further, it may be desirable to provide an alternate error storage as described above so that, as the CAM device performs self-correction and self-invalidation operations to clear errors in the error address register, those same errors remain logged in the alternate error storage. The host may then access the alternate error storage from time to time to determine whether errors have occurred and, if so, take appropriate actions to maintain coherency between the CAM array and the backup storage, and restore any invalidated CAM words.

Generating a Sequence of Error Check Addresses

Figure 19:
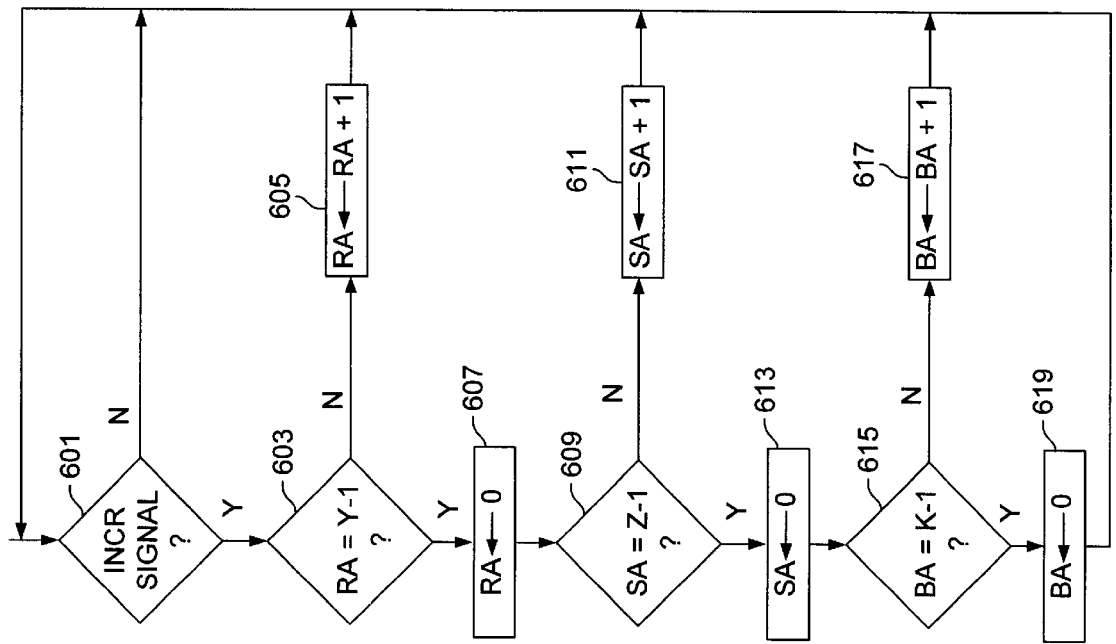
FIG. 19 illustrates the increment operation within an address generator used to generate a sequence of error check addresses.

FIG. 19 illustrates the increment operation within an address generator used to generate a sequence of error check addresses including, without limitation, the parity addresses and ECC addresses described above. In one embodiment, the error check address is formed by three address components: a block address, a segment address, and a row address. The block address is used to select one of a plurality of storage blocks, the segment address is used to select one of a plurality of segments within the selected storage block and the row address is used to select, within the selected segment, the row containing the CAM word (or partial CAM word) to be error checked. The block address component of the error check address may be omitted in a CAM device that includes only a single storage block, and the segment address component may likewise be omitted in a CAM device that has only one segment per storage block.

For the purpose of the present description, the address generator is assumed to be implemented in a CAM device having K storage blocks, each containing Z segments that are Y rows deep. Thus, the block address ranges from 0 to K−1, the segment address ranges from 0 to Z−1 and the row address ranges from 0 to Y−1.

Referring now to decision block 601, if an increment signal is detected, the row address (RA) of the error check address is evaluated in decision block 603 to determine if the row address has reached the row limit (i.e., the final row address, Y−1). This may be accomplished, for example, by a comparison of the row address and row limit in a comparator. Other techniques and circuits may also be used to detect when the row limit has been reached.

If the row address has not reached the row limit, the row address is incremented by one in block 605 to complete the increment operation. If the row address has reached the row limit, the row address is reset to zero in block 607, followed by evaluation of the segment address (SA) in decision block 609 to determine if the segment address has reached the segment limit (i.e., Z−1). If the segment address has not reached the segment limit, the segment address is incremented by one in block 611 to complete the increment operation. If the segment address has reached the segment limit, the segment address is reset to zero in block 613, followed by evaluation of the block address (BA) in decision block 615 to determine if the block address has reached the block limit (i.e., K−1). If the block address has not reached the block limit, the block address is incremented by one in block 617 to complete the increment operation. If the block address has reached the block limit, the block address is reset to zero in block 619 to complete the increment operation.

The increment operation may be changed in numerous ways in alternative embodiments. For example, in the increment operation described above, the row address is effectively treated as the least significant component of the error check address, followed by the segment address and then the block address. Any order of significance may be assigned to the row, segment and block addresses in alternative embodiments. For example, the block address may be incremented from 0 to K−1 before either the segment or row addresses are incremented, or the segment address may be incremented from 0 to Z−1 before either the block or row addresses are incremented.

In another implementation of the increment operation, one or more of the components of the error check address may be incremented by values other than one. For example, assuming Y is even, the row address component may be incremented by any odd value with modulo Y arithmetic being used to calculate the result (the decision block 603 of FIG. 19 may be modified, for example, to test for RA=Y−1−i, where i is the increment value). Also, the increment may be negative instead of positive such that the address components are counted down instead of up. Finally, the increment operation described in reference to FIG. 19 is used to separately address each row of each segment of each block. In alternative embodiments, the each segment of a given block may be accessed together to concurrently error check all the segments for a given row address component; or each segment within each of the blocks may be accessed together to concurrently error check the same row across all segments and all blocks. In yet another embodiment, the segment address may be incremented by a selectable amount according to the configuration of the corresponding storage block. For example, if the storage block is configured for a ×2 CAM word, the segment address may be incremented by two instead of one in block 611 of FIG. 19.

Embodiment Without Validity Bits

Each of the CAM device embodiments described thus far have included validity bits to indicate whether corresponding CAM words are valid and to gate the error flag signal accordingly. In alternative embodiments the validity bit storage may be omitted from the CAM device and the gating circuitry (e.g., element 222 of FIGS. 6 and 7, element 398 of FIG. 12, element 407 of FIG. 13, and element 513 of FIG. 16) omitted from the error detector. In one embodiment, for example, each of the rows of CAM cells may initially be filled with a default value (e.g., all '0's) and the parity bit (or bits) or other error check values for the row set accordingly. By this arrangement, all CAM words in the CAM array are effectively 'valid' in that known values together with appropriate error checking values have been stored in each of the rows of CAM cells. Accordingly, the error checking embodiments described herein may be modified by removing the validity-based gating circuitry (e.g., element 222 of FIGS. 6 and 7, element 398 of FIG. 12, element 407 of FIG. 13, and element 513 of FIG. 16), and then using the remaining circuitry to detect and log errors, and to perform self-correction operations. Self-invalidation operations may effectively be performed by resetting a corrupted CAM word to the default value.

System Structure and Operation

Figure 20:
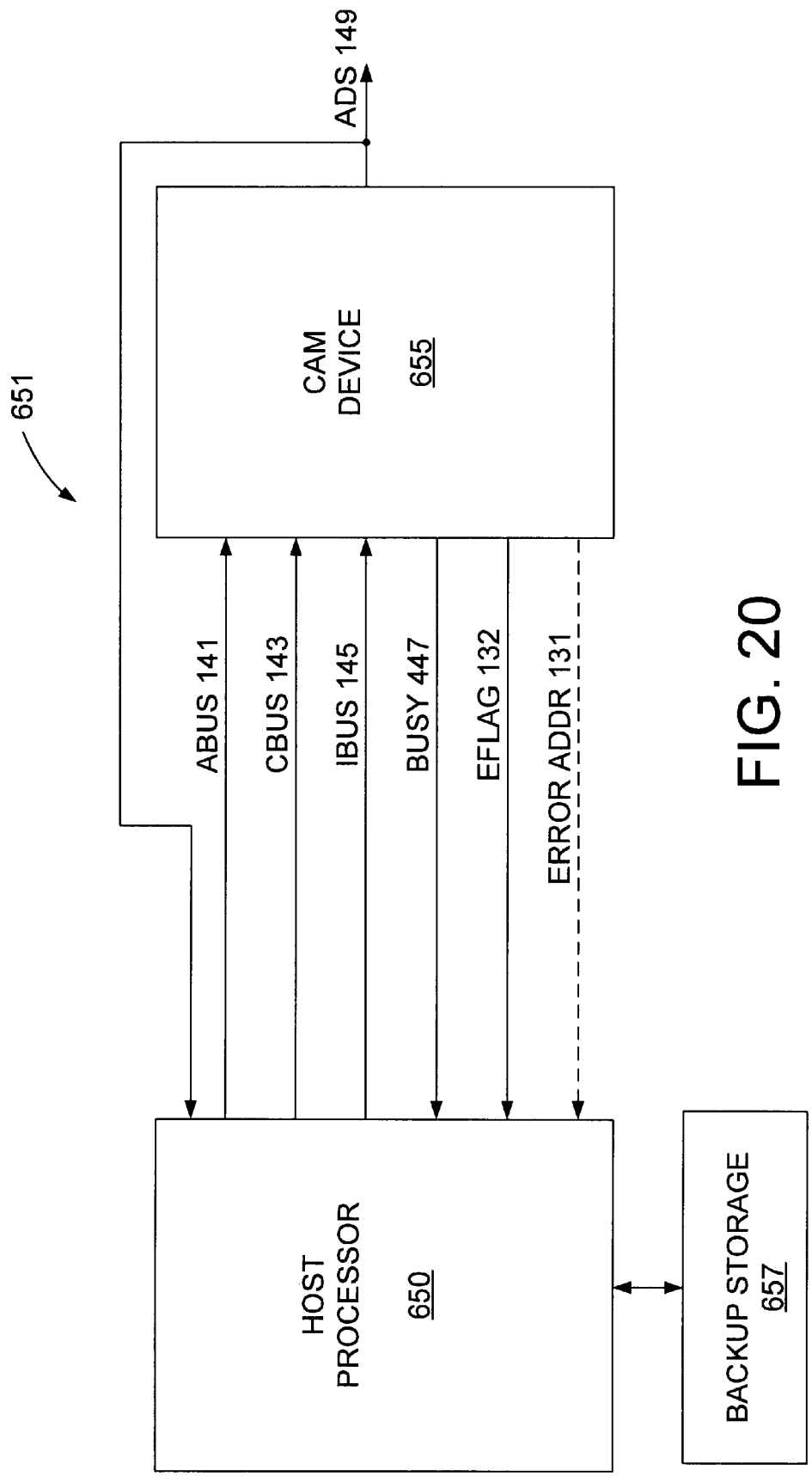
FIG. 20 illustrates a system device 651 that includes a host processor and CAM device according to an embodiment of the invention.

FIG. 20 illustrates a system device 651 that includes a host processor 650 (e.g., general purpose processor, digital signal processor, network processor, ASIC, etc.) and a CAM device 655 according to one of the embodiments described herein. The system device may be, for example, a network switch or router, or any other type of device in which the fast compare capability of the CAM device 655 may be useful.

The host processor 650 issues addresses, comparands, and instructions to the CAM device 655 via the address, comparand and instruction buses, respectively (i.e., ABUS 141, CBUS 143 and IBUS 145), and receives CAM indices and status information from the CAM device 655 via an address and status bus 149 (ADS). Though not shown in FIG. 20, the address and status bus 149 may additionally be coupled to supply CAM indices to an associated storage. The CAM indices may alternatively (or additionally) be output to the host processor 650 and/or the associated storage via a dedicated signaling path. Also, in alternative embodiments, one or more of the buses (e.g., ABUS, CBUS, IBUS, ADS) may be omitted and the corresponding information time multiplexed onto another of the buses. Further, the CAM device 655 and host processor 650 may be implemented in distinct integrated circuits (ICs) and packaged in distinct IC packages, or in a single IC (e.g., in an ASIC, system-on-chip, etc.), or in an IC package that includes multiple ICs (e.g., a multi-chip package, paper thin package, etc.).

Still referring to FIG. 20, the error flag signal 132 is preferably output from the CAM device 655 to the host processor 650 via a dedicated signal path (EFLAG), while the error address value 131 is preferably output from the CAM device 655 to the host processor 650 via the address and status bus 149. Alternatively, the error address 131 may be output to the host processor via a dedicated path as shown by the dashed line labeled ERROR ADDR in FIG. 20. Also, as discussed above, the error flag signal may alternatively (or additionally) be output to the host processor via the address and status bus 149. Further, a busy signal 447 may be output from the CAM device 655 to the host processor 650 to signal the host processor 650 that the CAM device 655 is busy performing a self-invalidation operation or self-correction operation as described above.

The host processor 650 is also coupled to a backup storage 657 which is used to store a backup copy of the CAM words stored in the CAM device 655. The backup storage 657 is preferably a non-volatile storage such as a battery-backed semiconductor storage, an electrically programmable read only memory (EPROM), a flash EPROM, or a magnetic or optical medium, but any type of data storage device may be used in alternative embodiments.

Figure 21:
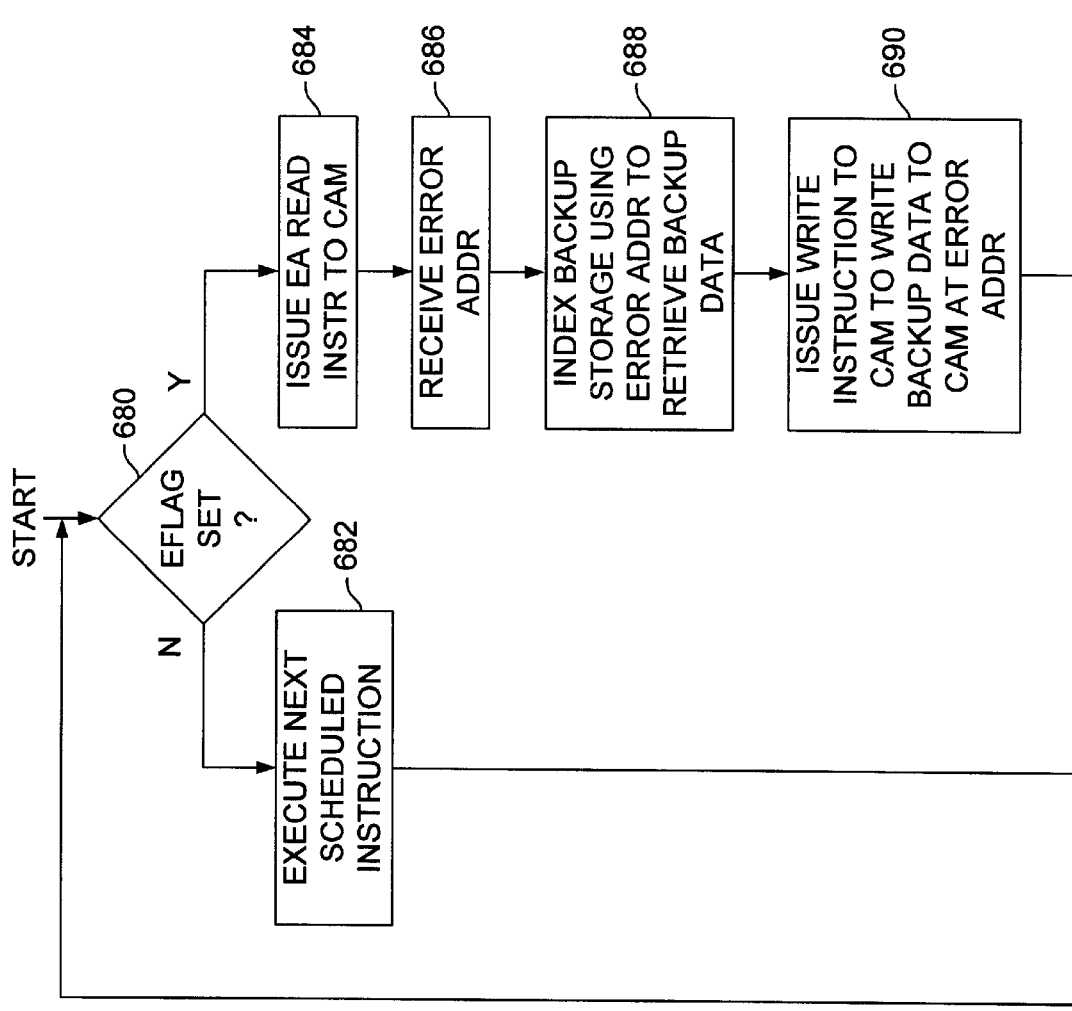
FIG. 21 illustrates the operation of the host processor of FIG. 20 according to one embodiment.

FIG. 21 illustrates the operation of the host processor of FIG. 20 according to one embodiment. Initially, at decision block 680, the host processor samples the error flag signal to determine whether the CAM device has detected an error in a CAM word. Sampling the error flag signal may involve, for example, sensing the error flag signal at a dedicated receiver of the host processor or issuing an instruction to the CAM device to output the error flag signal onto the address and status bus (or other signal line). If the error flag is not set, the host processor executes the next scheduled instruction, if any, in block 682. If the error flag is set, the host processor issues a instruction to the CAM device to output the error address (e.g., an "EA READ" instruction) in block 684. Some time later, at block 686, the host processor receives the error address from the CAM device, for example, via the address and status bus. At block 688, the host processor uses the error address to index (i.e., address) a backup storage device to retrieve backup data. After the backup data has been retrieved, the host processor issues an instruction to the CAM device at block 690 to write the backup data to the CAM array at the error address, thus overwriting the corrupted CAM word with an error free value.

Match Error Signaling

Figure 23:
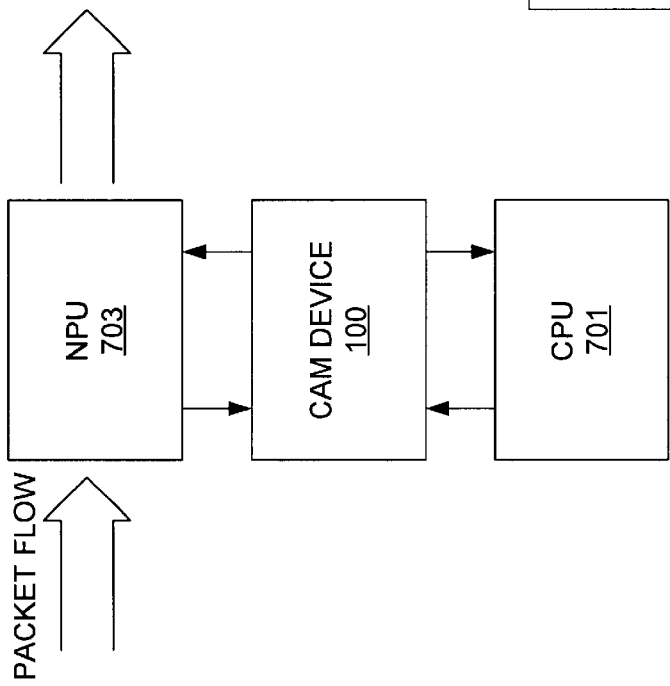
FIG. 23 illustrates use of the CAM device of FIG. 1 in an exemplary network switching or routing application.

FIG. 23 illustrates the use of CAM device 100 of FIG. 1 in an exemplary network switching or routing application. As shown, packet traffic flows through a network processing unit (NPU) 703 which issues read, write and compare instructions to the CAM device 100. For example, the NPU 703 may output a comparand to the CAM device 100 in the form of selected fields of an incoming packet, and instruct the CAM device 100 to perform a compare operation. The CAM device 100 responds by comparing the comparand to CAM words stored within the CAM array and outputting a match index and match flag (or flags) according to the comparison result.

Although the NPU 703 may act as a host processor (e.g., as described in reference to FIGS. 20 and 21), a central processing unit (CPU) 701 is often provided to perform some or all of the host processor actions described herein. For example, the CPU 701 may monitor an error flag signal from the CAM device 100 and take corrective action when an error is detected in a CAM word stored within the CAM device 100 (e.g., overwrite the corrupted CAM word with a data word from a backup storage). Depending upon the speed with which the CPU 701 responds to an error indication, the NPU 703 may request the CAM device 100 to perform any number of compare operations before the CPU 701 takes corrective action. If, during a given compare operation, a highest priority match is detected between a comparand value and a corrupted CAM word, the resulting match index may be invalid (i.e., if the defective bits within the corrupted CAM word are not masked in the compare operation, the match index will have resulted from a false match and therefore will be invalid). Accordingly, any match index generated between the time an error is detected within the CAM device 100 and the time the CPU 701 or other device takes corrective action may be invalid and may therefore result in incorrect routing or classification of the corresponding packet.

Figure 24:
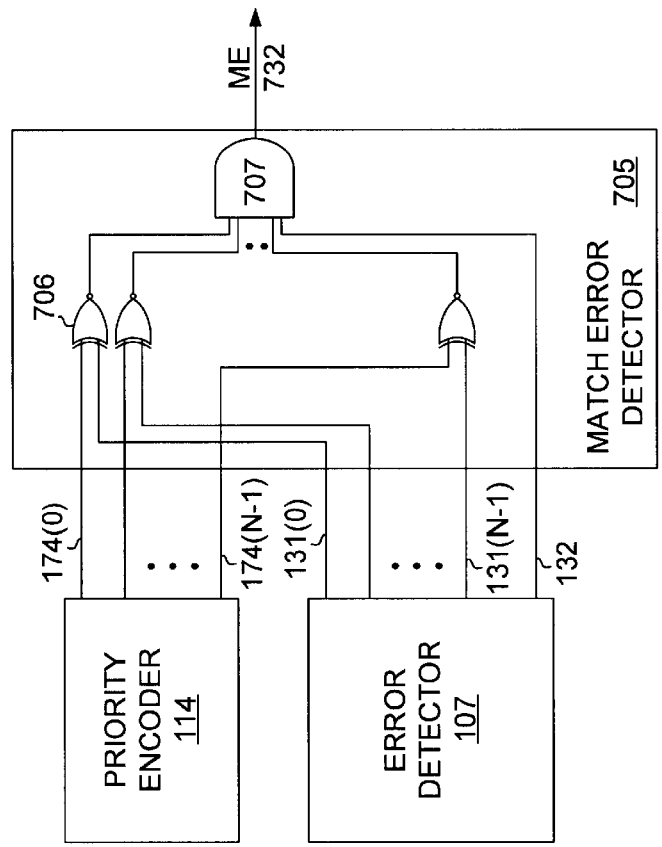
FIG. 24 illustrates a match error detector that may be included within the CAM device of FIG. 1 to generate a match error signal.

FIG. 24 illustrates a match error detector 705 that may be included within the CAM device 100 of FIG. 1 (or CAM device 441 of FIG. 14) to generate a match error signal 732. The match error signal 732, when asserted, indicates that a match index 174 generated during a compare operation has resulted from a match with a corrupted CAM word. An NPU or other device receiving the match index 174 may also receive the match error signal 732 and therefore decide, according to the state of the match error signal 732, whether to perform a given processing operation (e.g., forwarding or classification) on the corresponding packet. The recipient of an asserted match error signal 732 may also take other action, such as notifying another processor of the error condition, notifying another network node (e.g., router, switch, etc.) of the error condition so that the network node may take remedial action (e.g., rerouting network traffic), saving the processing operation that yielded the match error signal 732 for later retry, and so forth.

Figure 27:
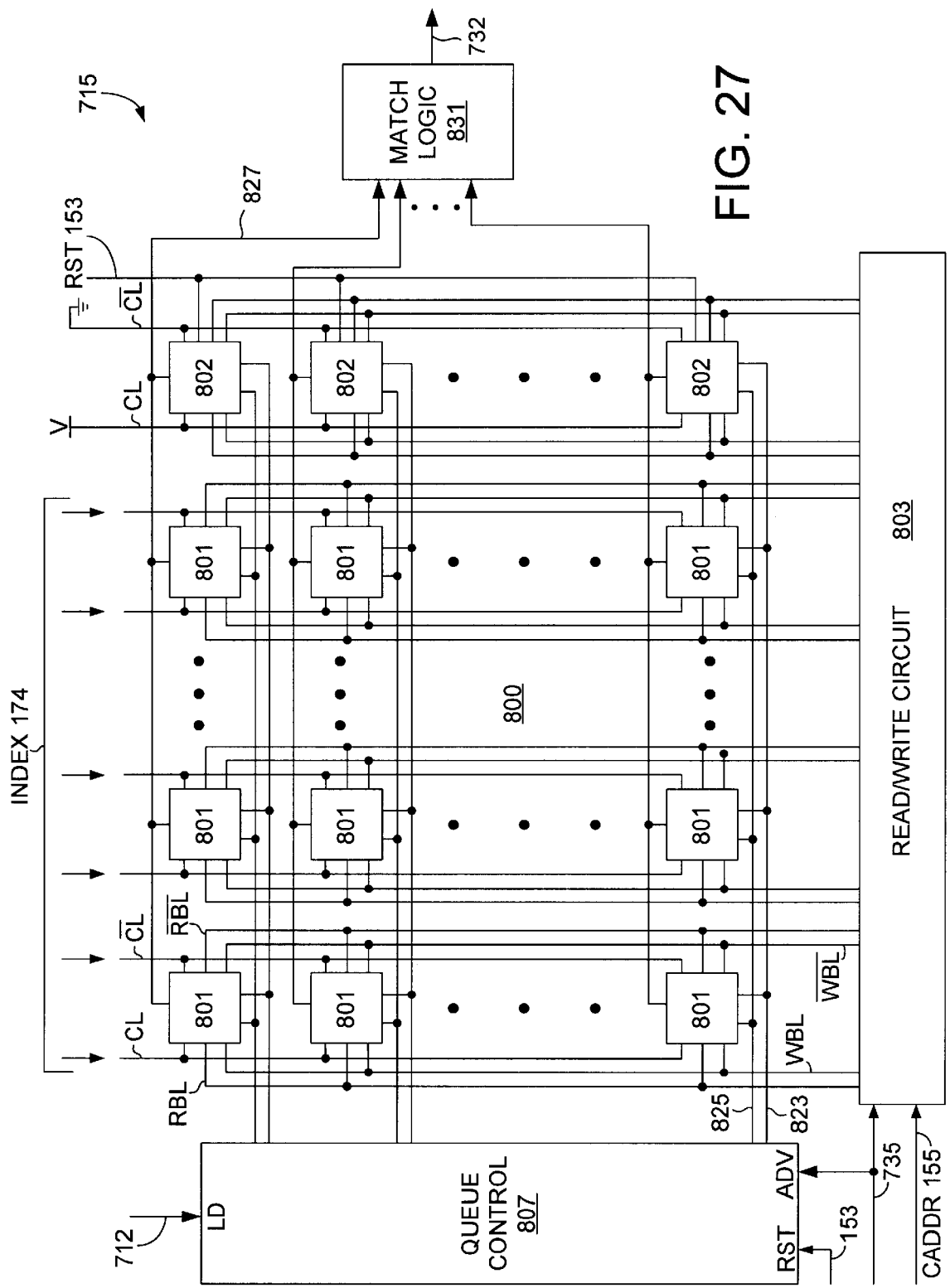
FIG. 27 illustrates an embodiment of the error CAM of FIG. 25 in greater detail.

Still referring to FIG. 24, the match error detector 705 receives an N-bit match index 174(0)–174(N–1) from a priority encoder 114, and an N-bit error address 131(0)–131(N–1) and error flag signal 132 from an error detector 107. The error address 131 and error flag signal 132 may be generated, for example, as described above in reference to FIG. 6. Match error detector 705 is a compare circuit that compares bits of the error address 131 with corresponding bits of the N-bit match index 174 to generate a match error signal 732. For example, as shown in FIG. 27, a set of N exclusive NOR gates 706 within the match error detector 705 compare respective bits of the match index 174(0)–174(N–1) with corresponding bits of the error address 131(0)–131(N–1) and output respective result signals to a logic AND gate 707. The logic AND gate 707 also receives the error flag signal 132 from the error detector 107. Each of the logic NOR gates 706 outputs a logic high result signal if the input error address bit and match index bit match (i.e., are in the same logic state), and a logic low result signal if the bits do not match. Accordingly, if the error flag signal 132 is asserted (indicating that the error address is valid), and the match index 174 matches the error address 131 bit-for-bit, then logic AND gate 707 will assert the match error signal 732 to indicate that the match index has resulted from a match with a corrupted CAM word. If the error flag signal 132 is deasserted (indicating that the error address is not valid) or if any bit (or bits) of the match index 174 does not match the corresponding bit of the error address 131, then the logic AND gate 707 will deassert the match error signal 732. In this way, a NPU or other processor may receive, for each match index 174 generated between the time a corrupted CAM word is detected within the CAM device and the time that corrective action is taken, an indication of whether the match index 174 has resulted from a match with the corrupted CAM word. Thus, if a processor receives a match index 174 together with an asserted match error signal 732, the processor may be programmed not to forward or classify the corresponding packet based on the match index, thereby avoiding incorrectly routing or classifying the packet.

Figure 25:
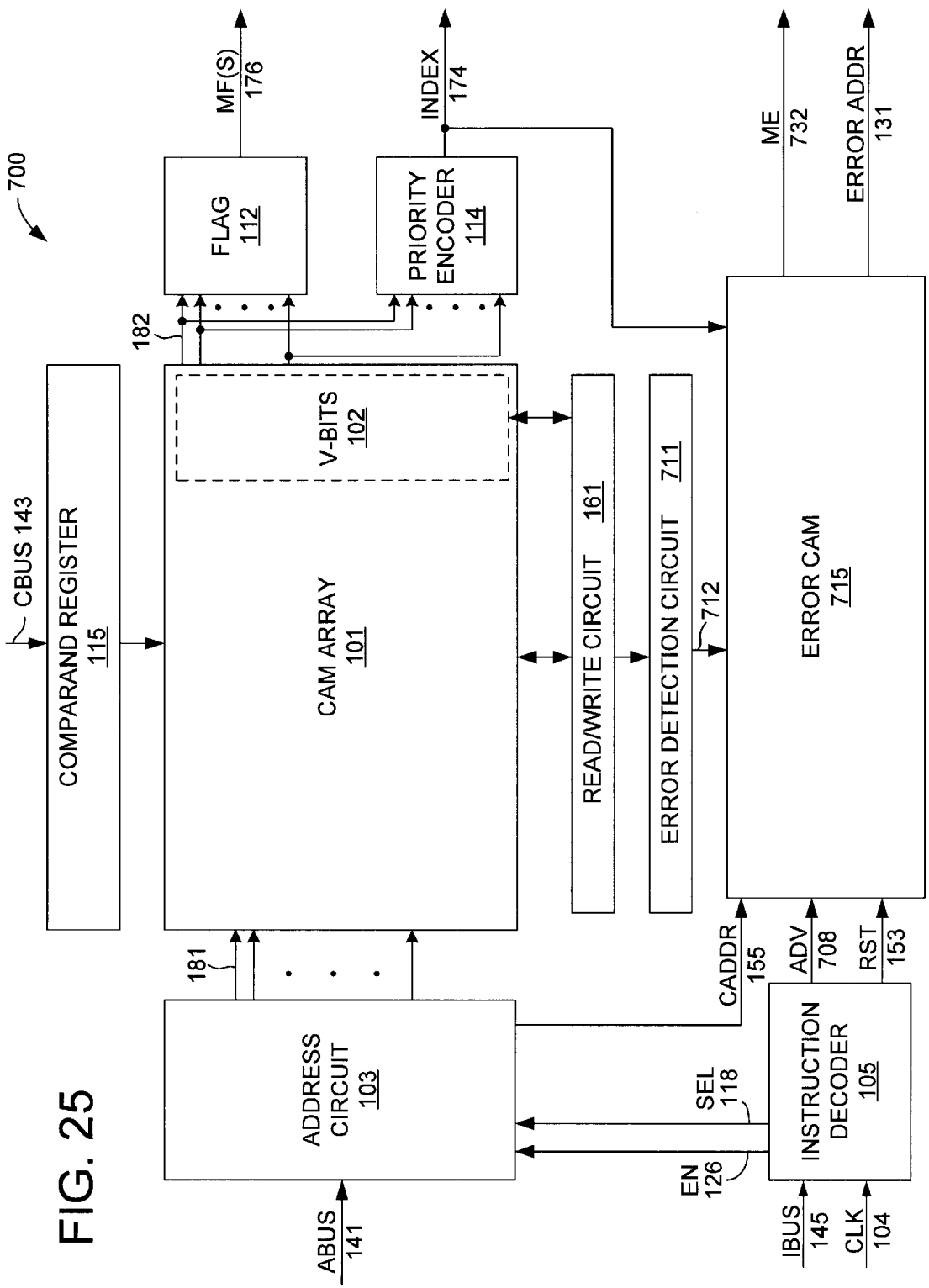
FIG. 25 illustrates a CAM device according to an embodiment that includes an error CAM to assert a match error signal if a match index matches any of a plurality of error addresses.

FIG. 25 illustrates a CAM device 700 according to an embodiment that includes an error CAM 715 to assert a match error signal 732 if a match index 174 matches any of a plurality of error addresses. In addition to the error CAM 715, the CAM device 700 includes a CAM array 101 (optionally including validity bits 102), address circuit 103, instruction decoder 105, flag circuit 112, priority encoder 114, comparand register 115, read/write circuit 161 and error detection circuit 711. The CAM device 700 also includes interfaces to receive an instruction bus 145, address bus 141, comparand bus 143 and a clock line (providing clock signal 104) as described in reference to FIG. 1. Further, the instruction decoder 105, address circuit 103, CAM array 101, comparand register 115, read/write circuit 161, flag circuit 112 and priority encoder 114 are coupled to one another and operate generally as described in reference to FIGS. 1–5. That is, the instruction decoder 105 issues enable and select signals (126 and 118) to the address circuit 103 to control the generation of a sequence of check addresses 155. For each check address 155 in the sequence, the address circuit 103 activates a corresponding one of a plurality of word lines 181 to enable a selected CAM word to be read from the CAM array 101 by the read/write circuit 161. An error detection circuit 711, which may be implemented, for example, by the parity check circuit 201 and logic gate 222 described above in reference to FIG. 6 (or any of the other error detection embodiments described above), is coupled to receive the selected CAM word from the read/write circuit 161 and to output an error signal 712 to the error CAM 715. The error detection circuit 711 asserts the error signal 712 upon detecting an error in the selected CAM word and deasserts the error signal 712 if no error is detected.

In one embodiment, the error CAM 715 includes an error CAM array and a queue control circuit that establishes a first-in-first-out (FIFO) protocol for storing error address values (i.e., check addresses 155) within the error CAM array. That is, the queue control circuit forms a queue of storage locations within the error CAM array, and, in one embodiment, includes a read pointer that points to the least recently stored (i.e., oldest) error address value within the queue (the head of the queue), and a write pointer that points to the most recently stored error address value within the queue (the tail of the queue). If the error signal 712 is asserted, the error CAM 715 advances the write pointer to point to a next available storage location, the new queue tail, then loads the check address 155 for the selected CAM word (i.e., the CAM word determined to have an error) into a storage location indicated by the write pointer (alternatively, the check address may be loaded prior to advancing the write pointer). If an advance signal 708 is asserted by the instruction decoder 105, the error CAM 715 clears a validity value stored in the queue head location, thereby releasing the oldest error address value from the queue, then advances the read pointer to establish a storage location containing the next least recently stored error address value as the new head of the queue. In one embodiment, the error address at the queue head is output from the error CAM 715 via a dedicated read port to provide the error address signal 131.

As with embodiments discussed above, the error address signal 131 may be output from the CAM device 700 via a dedicated interface, via a multiplexed interface (e.g., to a status bus), via a status word, and via any other output node of the CAM device. As shown in FIG. 25, the error CAM 715 may receive a reset signal 153 to reset the error CAM 715 during initialization of CAM device 700.

As discussed above, the error checking engine implemented by the check address generator (i.e., within address circuit 103), read/write circuit 161 and error detection circuit 711 may operate in the background as compare operations are performed within the CAM device 700. That is, concurrently with checking a selected CAM word for error, a comparand value received via the CBUS 143 (and optionally stored in the comparand register 115) may be compared with the contents of the CAM array 101 to determine whether the comparand value matches any valid CAM words stored within the CAM array 101. A plurality of match lines 182, coupled to respective rows of CAM cells within the array 101 (as described in reference to FIG. 5), are provided to deliver match signals to the flag circuit 112 and the priority encoder 114, each match signal indicating whether a CAM word stored within a respective row of CAM cells matches the comparand value. If any of the match signals is asserted, thereby indicating a match, the flag circuit 112 outputs a match flag signal 176 (and, optionally, a multiple match flag signal if more than one of the match signals is asserted), and the priority encoder 114 outputs a match index 174 that corresponds to the highest priority row of CAM cells containing a CAM word that matches the comparand value.

The match index 174, in addition to being output from the CAM device 700, is input to the error CAM 715 for comparison with error address values queued therein. If the match index 174 matches any of the error address values, the match error signal 732 is asserted to indicate that the match index corresponds to a corrupted CAM word within the CAM array 101. The match error signal 732 may then be used by the recipient device (e.g., NPU, CPU, etc.) as discussed above in reference to FIG. 24 to make packet processing decisions.

Figure 26:
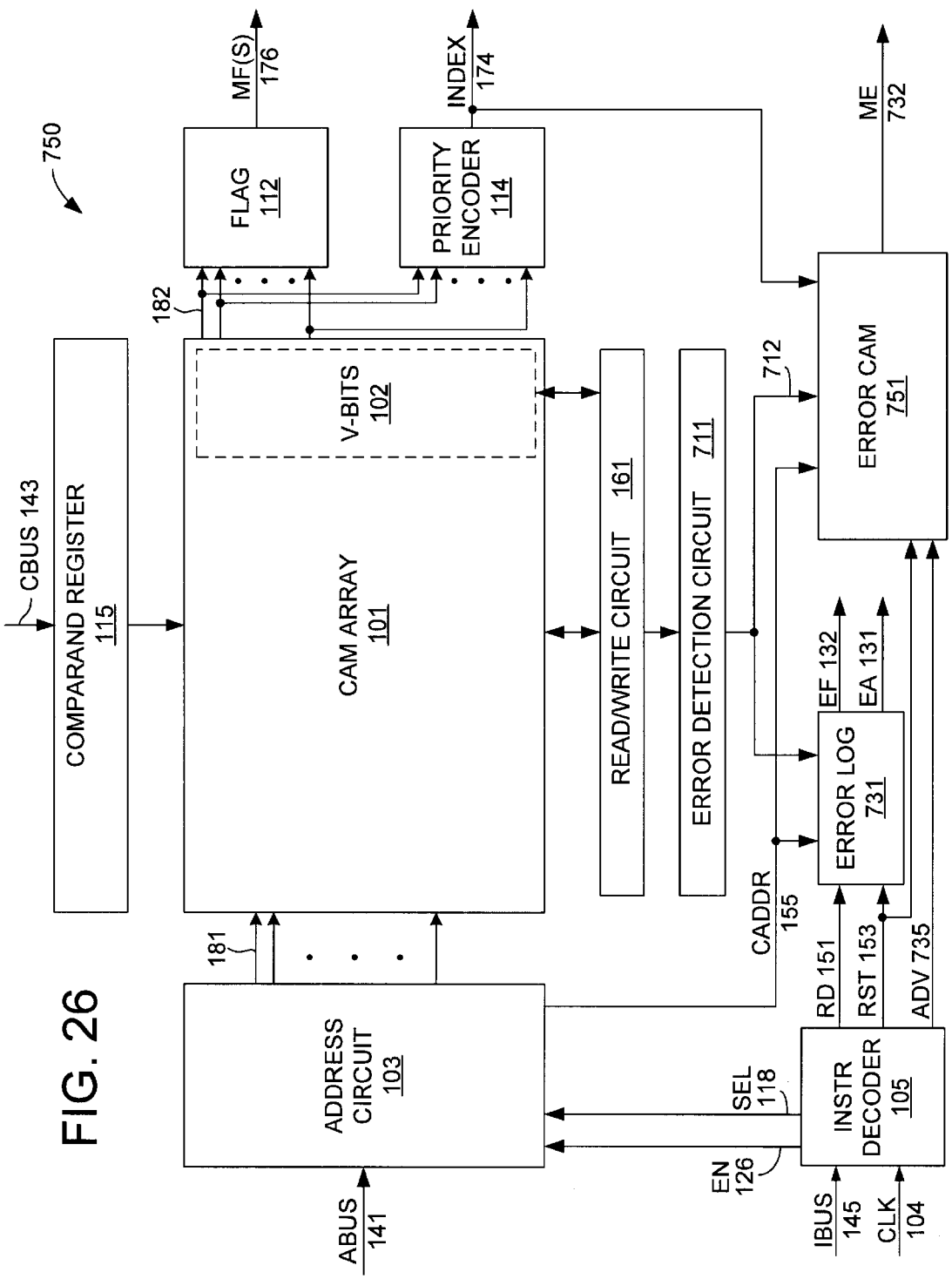
FIG. 26 illustrates an alternate embodiment of a CAM device that includes an error CAM.

It should be noted that the multiple-entry error address register 289 of FIG. 7 may be used to implement CAM array 715 in one embodiment, with each error address entry within the multiple-entry error address register being formed by a respective row of CAM cells. FIG. 26 illustrates an alternative embodiment of a CAM device 750 that includes an error CAM. The CAM device 750 includes a CAM array 101, address circuit 103, instruction decoder 105, flag circuit 112, priority encoder 114, comparand register 115, read/write circuit 161 and error to detection circuit 711, each coupled as described in reference to FIG. 25 (e.g., via internal signals 118, 126, 181, 182, and to buses 141, 143 and 145), and each cooperating as described in reference to FIG. 25 to generate a match flag signal (or signals) 176, a match index 174 and an error signal 712.

The CAM device 750 differs from the CAM device 700 of FIG. 25 in that the error is logging and match error detection functions are split between an error log circuit 731 and an error CAM 751, respectively, rather than being performed within a single error CAM circuit. The error log circuit 731 may include, for example, the error address register 203 and S/R flip-flop 224 described in reference to FIG. 6, or the multiple-entry error address register 289 of FIG. 7, or any other circuits for storing error addresses and outputting the error address signal 131 and error flag signal 132. The error CAM 751 includes circuitry to compare the match index 174 to error address values stored within the error CAM 751 and to output a match error signal 732 if the index matches any of the error address values. The error CAM 751 may be implemented in the same manner as error CAM 715 of FIG. 25, except that the dedicated read port for outputting the error address 131 may be omitted. The reset signal 153 may be used to reset both the error log 731 and the error CAM 751 during device initialization. Also, the advance signal 735 may be used to advance the queue head within the error CAM 715 as discussed in reference to FIG. 25.

FIG. 27 illustrates an embodiment of the error CAM 715 of FIG. 25 in greater detail. The error CAM 715 includes an error CAM array 800, read/write circuit 803, queue control circuit 807, and match logic circuit 831. The CAM array 800, is organized in rows and columns of CAM cells with each row of CAM cells including a number of storage CAM cells 801 and a validity CAM cell 802. Within a given row, the storage CAM cells 801 are used to store an error address value, while the validity CAM cell 802 is used to store a validity value that indicates whether a valid error address value is stored within the corresponding storage CAM cells 801. In one embodiment, each storage CAM cell 801 includes a memory element to store a single bit of an error address value, and each row of CAM cells includes a sufficient number of storage CAM cells 801 to store an N-bit error address value, where N is at least $\log_2 R$ (R being the number of independently addressable storage locations in the CAM array 101 of FIG. 1 so that $\log_2 R$ is the size, in bits, of an error address value that decodes to a unique row or row segment within the data CAM array 101 of FIGS. 25 and 26). In alternate embodiments, more or fewer storage CAM cells 801 may be included in each row of CAM cells within the error CAM array 800. For example, in a CAM device that may be coupled to additional CAM devices in a cascade arrangement (effectively multiplying the size of the data CAM array 101 of FIGS. 25 and 26 by the number of cascaded devices), additional storage CAM cells 801 may be included within each row of the error CAM array 800 to uniquely identify one of the cascaded CAM devices.

Still referring to FIG. 27, each row of CAM cells within error CAM array 800 is coupled to the queue control circuit 807 via a respective read word line 823 and write word line 825, and to the match logic circuit 831 via a respective match line 827. Each column of CAM cells, including the column of validity CAM cells 802, is coupled to a pair of comparand lines, CL and $\overline{CL}$, to receive a comparand bit and its complement; to a pair of write bit lines, WBL and $\overline{WBL}$, to receive an error address value during a load operation; and to a pair of read bit lines, RBL and $\overline{RBL}$. In one embodiment, the read bit lines coupled to the columns of storage CAM cells form a read port for outputting the error address signal (i.e., signal 131 of FIG. 25). The read bit lines coupled to the column of validity CAM cells 802 may also be used to read out the validity value(s) stored therein. The read bit lines (or the write bit lines) coupled to the column of validity CAM cells 802 may also be used during or after a queue advance operation to clear the validity value stored within the storage location at the head of the queue. For example, after the error address stored in a row of CAM cells 801 is read, the error address may be used to select the validity CAM cell 802 of the same row (either in the same or a subsequent clock cycle) and the validity value overwritten via the read or write bit lines to an invalid state. Alternatively, while the row of CAM cells 801 is selected for reading (e.g., via the read word line RWL), the corresponding validity CAM cell 802 of the same row may be selected (e.g., by the RWL or WWL), and may be written (simultaneously or sequentially)

to an invalid state over the read or write bit lines. The component bits of the match index 174 constitute the comparand bits supplied to the CAM cells 801 during a compare operation, while dedicated logic high and logic low inputs (shown, for example, as supply voltage and ground reference connections, respectively, in FIG. 27) form the comparand value provided to the validity CAM cells 802. In alternative embodiments, the signals provided to the validity CAM cells 802 via the comparand signal lines may be programmable rather than the pair of fixed-level signals shown in FIG. 27.

The read/write circuit 803 is used in conjunction with the queue control circuit 807 to store error address values in the CAM array 800. As discussed above, in one embodiment, the queue control circuit 807 includes read and write pointers that enable the error CAM array 800 to be operated as a queue. The write pointer points to a row of CAM cells that constitute a tail storage location of the queue, and the read pointer points to a row of CAM cells that constitute a head storage location of the queue. Error address values are loaded into the queue at the tail storage location, and read out of the queue at the head storage location. More specifically, when an error signal 712 is detected at a load input of the queue control circuit 807, the queue control circuit 807 increments the write pointer to point to an available row of CAM cells within the error CAM array 800, then activates a word line 825 indicated by the write pointer to select (i.e., enable) the row of CAM cells to receive an error address via the write bit lines, WBL and $\overline{\text{WBL}}$. The read/write circuit 803 receives an error address value from the address circuit (e.g., element 103 of FIGS. 25 and 26) in the form of a check address 155 and drives the constituent bits of the error address value onto respective pairs of write bit lines for storage within the selected row of storage CAM cells 801. Also, the read/write circuit 803 drives a validity value onto the write bit lines coupled to the column of validity CAM cells 802 so that the validity CAM cell 802 corresponding to the selected row of storage CAM cells 801 will store a valid indication for the newly stored error address value.

In one embodiment, the read pointer is used to select the row of CAM cells coupled to the read port formed by the read bit lines, RBL and $\overline{\text{RBL}}$. More specifically, the read pointer is decoded to activate a read word line 823 coupled to the row of CAM cells at the head of the queue, thereby enabling the error address at the head of the queue to be output via the read bit lines as the error address signal 131. When an advance signal 735 is asserted, the read/write circuit 803 drives an invalidity value onto the read bit lines coupled to the column of validity CAM cells 802 to clear the validity indication for the error address at the head of the queue. After the validity value at the head of the queue is cleared, the queue control circuit increments the read pointer to establish a new storage location as the head of the queue.

CAM cells 801 may be any type of CAM cell including, without limitation, binary, ternary, NAND, NOR, volatile or nonvolatile. Additionally, a single read bit line may be used instead of the pair of read bit lines (RBL and $\overline{\text{RBL}}$), a single write bit line may be used instead of the pair of write bit lines (WBL and $\overline{\text{WBL}}$), and/or a single comparand line may be used instead of the pair of comparand lines (CL and $\overline{\text{CL}}$). Further, instead of providing separate the read bit lines, write bit lines, and comparand lines, only one or two signal lines (or signal line pairs) may be provided in alternative embodiments with the signals for the omitted bit lines and/or comparand lines multiplexed onto the provided signal lines.

The reset signal 153 is input to the queue control circuit 807 and to the column of validity CAM cells 802. When the reset signal 153 is asserted, the read and write pointers within the queue control circuit are reset to an initial state, and the validity value within each of the validity CAM cells 802 is cleared.

When a match index 174 is received within the error CAM array 800 (i.e., via the comparand signal lines), the match index is simultaneously compared with each error address value stored within the CAM array 800. In the embodiment of FIG. 27, if a bit of the error address value stored within a given CAM cell 801 does not match the corresponding bit of the match index, a compare circuit within the CAM cell 801 will force the match line 827 to signal a mismatch condition. Similarly, if the value stored within a given validity CAM cell 802 indicates that the corresponding CAM cells 801 do not contain a valid error address value, the validity CAM cell 802 will force the match line 827 to signal a mismatch condition. If a valid error address value stored within a given row of CAM cells matches the match index, then the corresponding match line 827 will signal a match condition. In the embodiment of FIG. 26, the match signal present on a given match line effectively represents a wired NOR of mismatch signals output by the individual CAM cells 801 coupled to the match line. That is, the active low mismatch indications from each of the CAM cells 801 are effectively ORed with one another to produce an active high match signal on the corresponding match line 827. In an alternate embodiment, the match signals output by each of the CAM cells 801 in a given row may be logically combined in a logic gate (e.g., an AND, OR, NAND or NOR logic gate) with an output of the logic gate being used to set the signal level on match line 827. More generally, any circuit for generating a signal indicative of whether an error address value stored within a row of CAM cells matches the match index 174 may be used without departing from the spirit and scope of the present invention.

In one embodiment, the match logic circuit 831 is implemented by an OR logic circuit so that, if a match signal is asserted to a high logic state (i.e., has a logical state indicative of a match condition) on any of the match lines 827, the match logic circuit 831 will assert the match error signal 732. Other logic circuits may be used to implement the match logic circuit 831 in alternative embodiments.

Figure 28:
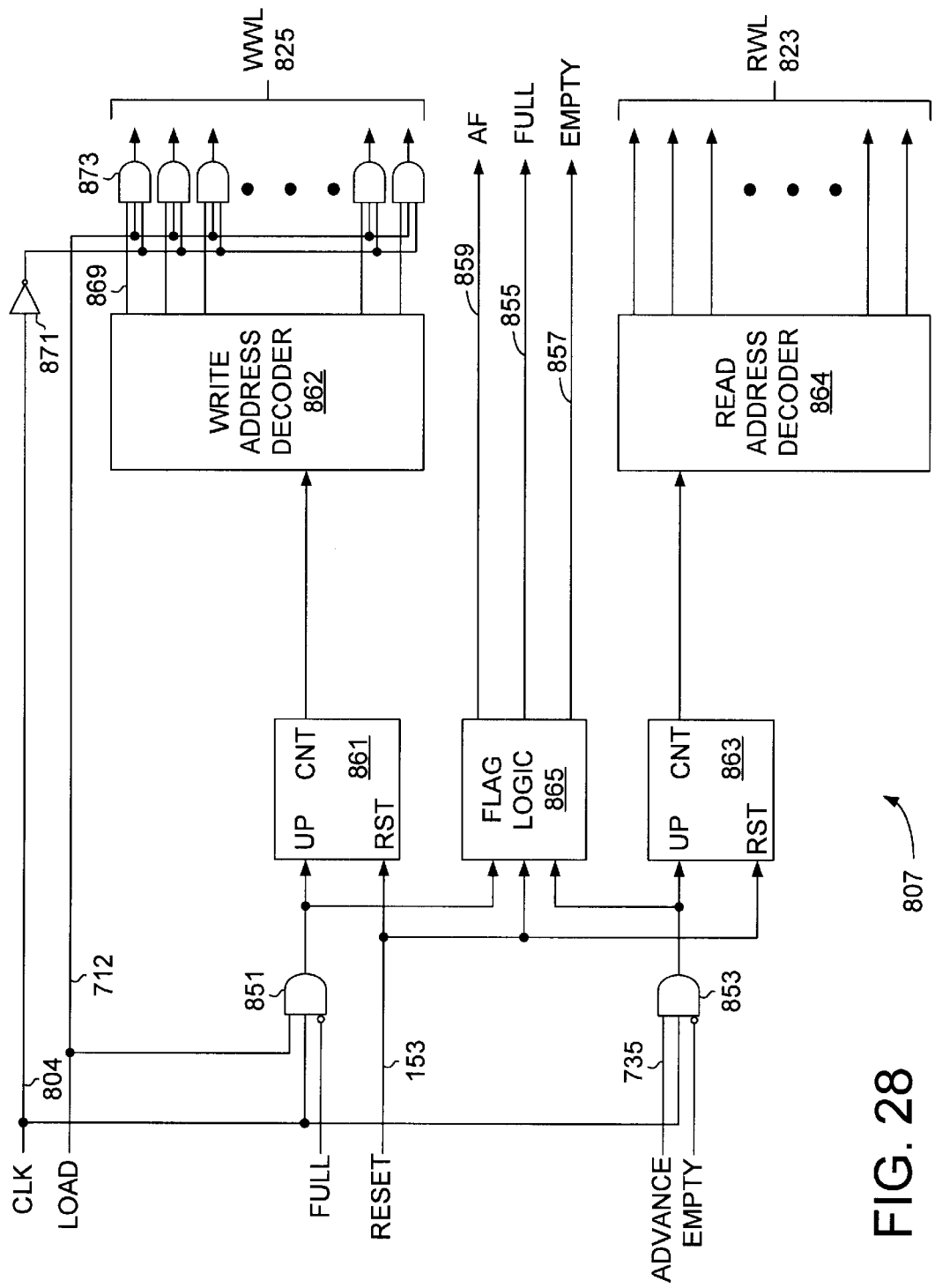
FIG. 28 illustrates the queue control circuit of FIG. 27 according to one embodiment.

FIG. 28 illustrates the queue control circuit 807 of FIG. 27 according to one embodiment. The queue control circuit 807 includes a write pointer 861, write address decoder 862, read pointer 863, read address decoder 864, and flag logic circuit 865. In the embodiment of FIG. 28, the read and write pointers 861, 863 are each implemented by an up counter having a strobe input (UP), a reset input (RST) and a count output (CNT). A count value maintained within each counter 861, 863 is incremented by one in response to a rising edge at the strobe input, reset to a start count in response to a high logic level signal at the reset input, and output as a binary-encoded set of bits at the count output. In one embodiment, each of the counters 861, 863 is a modulo M counter that counts up from zero to M−1, then rolls back to zero. Counter 863 is reset to zero and counter 861 is reset to M−1 (and therefore will roll to 0 during the first load operation following a reset) when the reset signal 153 is asserted. In an alternate embodiment, the counters 861 and 863 may default to any value (including different values from one another) upon assertion of reset signal 153, and may count down instead of up. Also, instead of incrementing by one in response to a rising edge signal at the strobe input, the counters may be incremented by any value, positive or negative.

A queue load operation is initiated when a full signal 855 is deasserted by the flag logic circuit 865 and a load signal 712 (i.e., error signal 712 of FIGS. 25, 26 and 27) is asserted. More specifically, logic AND gate 851 responds to the assertion of the load signal 712 and the deassertion of the full signal 855 by passing a rising edge of clock signal 804 to the strobe input of the write pointer 861 (i.e., as write strobe signal 852), thereby incrementing the count value within the write pointer 861. Note that clock signal 804 may be the clock signal 104 discussed above, a clock signal derived from clock 104, or another clock signal or control signal.

The count value maintained within the write pointer 861 constitutes a queue tail address and is output to the write address decoder 862. In one embodiment, the write address decoder 862 is a $\log_2 M$ to M decoder which asserts one of M write enable signals 869 according to the queue tail address (M being the number of independently addressable rows of CAM cells within the error CAM array). The M write enable signals are input, respectively, to a set of M logic AND gates 873 which are used to drive the write word lines 825. Each of the logic AND gates 873 also receives the load signal 712 and an inverted version of clock signal 804 via inverter 871. Accordingly, at a falling edge of the clock signal 804, and while the load signal 712 is asserted, the asserted one of the write enable signals 869 enables a corresponding one of the logic AND gates 873 to activate the write word line that corresponds to the incremented queue tail address. In one embodiment, the load signal remains asserted long enough for the read/write circuit 803 (described above in reference to FIG. 27) to write an error address value and validity value into the row of CAM cells selected by the activated write word line.

The count value maintained within the read pointer 863 constitutes a queue head address and is output to the read address decoder 864. In one embodiment, the read address decoder 864 is also a $\log_2 M$ to M decoder which activates a selected one of M read word lines 823 according to the queue head address. Unlike write word lines which are activated only during load operations, the selected read word line 823 remains activated until an advance operation is performed to increment the read word line selection. By this arrangement, the error address stored within the row of CAM cells coupled to the selected read word line is output as an error address signal via the read port formed by the read bit lines, RBL and $\overline{\text{RBL}}$, described in reference to FIG. 27.

Reflecting upon the operation of the write pointer and write address decoder, it will be appreciated that, prior to initiation of a load operation, the write pointer points to a row of CAM cells containing the most recently stored error address value. During a load operation, the write pointer is first incremented to point to an available storage location (effectively advancing the queue tail), then an error address value is loaded into the storage location. This order of operation may be reversed in alternative embodiments by first loading an error address value into an available storage location, then incrementing the write pointer to point to a next available storage location. In such an embodiment (which may be achieved, for example, by removing inverter 871 and inverting the clock signal at the input to logic AND gate 851), the write pointer 861 may be reset to the same initial value as the read pointer 863 in response to the reset signal 153.

A queue advance operation is initiated when an empty signal 857 is deasserted by the flag logic circuit 865 and the advance signal 735 is asserted. More specifically, logic AND gate 853 responds to assertion of the advance signal 735 and deassertion of the empty signal 857 by passing a rising edge of clock signal 804 to the strobe input of the read pointer 863 (i.e., as read strobe signal 854), thereby incrementing the queue head address.

Reflecting on the operation of the queue control circuit 807, it can be seen that, at any given time, the read and write pointers 861 and 863 define which rows of CAM cells within the error CAM array (e.g., element 800 of FIG. 27) are included within the queue. Accordingly, in an alternative embodiment, the validity CAM cells 802 and associated signal lines may be omitted from the CAM array 800 of FIG. 27 and the read and write pointers may be used to disable match indications for those rows of CAM cells not included within the queue.

FIG. 29 illustrates an embodiment of the flag logic circuit 865 of FIG. 28. The flag logic circuit 865 includes a counter 891 that maintains a queue depth count, and compare circuits 892, 894 and 896 to determine when the queue depth count is at a maximum (M), near maximum (greater than K), and zero, respectively. Logic AND gates 893 and 895 are provided to generate conditioned read and write strobe signals 866 and 867, respectively. More specifically, logic AND gate 893 receives the write strobe signal 852 at a non-inverting input, and receives the read strobe signal at an inverting input. By this arrangement, a rising edge of the write strobe signal 852 is passed through the logic AND gate 893 except when the read strobe signal 854 is high. Similarly, logic AND gate 895 receives the write strobe signal at an inverting input and the read strobe signal 854 at a non-inverting input so that a rising edge of the read strobe signal 854 passes through the logic AND gate 895 except when the write strobe signal 852 is high. By this arrangement, the conditioned read and write strobe signals 866, 867 correspond to the read and write strobe signals 852, 854, respectively, except that the conditioned read and write strobe signals 866, 867 are prevented from being in a logic high state (or transitioning to a logic high state) at the same time. The counter 891 receives conditioned write and read strobe signals 866, 867 at respective up and down count inputs, and includes logic to increment the queue depth count by one in response to the conditioned write strobe signal 866 and decrement the queue depth count by one in response to the conditioned read strobe signal 867. Initially, and whenever the reset signal 153 is asserted, the queue depth count is reset to zero, causing compare circuit 896 to assert the empty signal 857. Assertion of the empty signal 857 disables logic AND gate 853 of FIG. 28 from asserting the read strobe signal 854. Accordingly, queue advance operations are blocked when the queue is empty. During a load operation, assertion of the write strobe signal 852 causes the queue depth count to be incremented by one. Accordingly, after the first load operation, the queue depth count is no longer equal to zero so that the empty signal 857 is deasserted and queue advance operations are permitted. If the queue depth count reaches K+1, K being an integer value between 0 and M, the almost full signal 859 is output to indicate the near full condition of the error CAM array. In one embodiment, the value of K (i.e., the warning value) may be maintained in a register or other storage element within a CAM device and runtime programmed by a host processor. In another embodiment, the warning value may be onetime programmable, for example, by blowing fuses or otherwise recording a non-volatile value within the CAM device. Alternatively, the warning value (K), may be set to reflect a half-full state, an almost empty state, or any other indication of the number of error address values stored in the error CAM array. Also, any number of additional warning values and corresponding compare circuits 894 may be provided to generate a plurality of queue status signals in alternative embodiments. If the queue depth count reaches M, then the queue is full (i.e., M more load operations have been performed than advance operations), and the comparator 892 asserts the full signal 855. Assertion of the full signal 855 disables logic AND gate 851 of FIG. 28 from asserting the write strobe signal 852, thereby preventing queue load operations.

The empty signal 857, full signal 855 and almost full signal 859 may be output to a processor (or other device) via a dedicated output interface or via a multiplexed interface. In another embodiment, the empty, full, and almost full signals are used to set corresponding bits within a status word that may be read by a processor (or other device) in a status read operation. Also, circuitry to generate the almost full signal may be omitted altogether.

By preventing the conditioned read and write strobe signals 866, 867 from transitioning to a high logic state at the same time, the logic AND gates 893, 895 prevent the queue depth count from being changed during a clock cycle in which both the write strobe signal 852 and the read strobe signal 854 are asserted. Different types of circuits within (or external to) the counter 891 may be used for this purpose in alternative embodiments. Also, the flag logic circuit 865 may be implemented differently in alternative embodiments. For example, rather than maintain a queue depth count, the flag logic 865 may compare the count outputs of the write pointer 861 and the read pointer 863 to determine full, almost full and empty conditions.

FIG. 30 illustrates the CAM cell 801 of FIG. 27 according to one embodiment. The CAM cell 801 is a multi-ported CAM cell that includes storage element 901, compare circuit 910 and switch circuits 906–909. A write port formed by write bit lines WBL and $\overline{\text{WBL}}$ is coupled to the storage element 901 via switch circuits 907 and 906, while a read port formed by read bits lines RBL and $\overline{\text{RBL}}$ is coupled to the storage element 901 via switch circuits 909 and 908. When write word line 825 is activated, switch circuits 906 and 907 are switched on, enabling a data value present on the write bit lines to be stored within the storage element 901. Similarly, when the read word line 823 is activated, switch circuits 908 and 909 are switched on, enabling the data value stored within storage element 901 to be output onto the read bit lines. The compare circuit 910 is coupled to receive the data value from the storage element 901, and is coupled to a comparand port formed by comparand signal lines CL and $\overline{\text{CL}}$. During a compare operation, the compare circuit receives a comparand value via the comparand port, and compares the comparand value to the stored data value. The compare circuit outputs a match signal to affect a logical state of the match line 827 according to the compare result.

FIG. 31 illustrates an embodiment of the multi-ported CAM cell 801 of FIG. 30 in greater detail. As discussed above, the CAM cell 801 is a multi-ported CAM cell that includes storage elements 901, a compare circuit 910. In the embodiment of FIG. 31, transistor switches 917–920, coupled as pass gates, are used to implement the switch circuits and pass gates 906–909, respectively, of FIG. 30. The storage element 901 is depicted in FIG. 31 as being implemented by back-to-back coupled inverters, though different types of storage elements may be used in alternative embodiments including, without limitation, dynamic storage elements (typically implemented by a single transistor and charge storage element), non-volatile storage elements or any other type of storage element that can be used to store digital data.

The storage element 901 is coupled to write bit lines WBL and $\overline{\text{WBL}}$ via the pass gates 917 and 918 respectively. Gate terminals of the pass gates 917 and 918 are coupled to a write word line 825 so that, when the write world line 825 is activated, the complementary signals present on the write bit lines are applied to the storage element 901 to store a data value therein. The storage element 901 is coupled to read bit lines RBL and $\overline{\text{RBL}}$ via pass gates 919 and 920. Gate terminals of the pass gates 919 and 920 are coupled to a read word line 823 so that, when the read word line 823 is activated, the data value stored within storage element 901 is output as a complementary pair of signals on the read bit lines.

Still referring to FIG. 31, the compare circuit 910 includes transistors 911, 912, 913 and 914. Transistors 911 and 912 are coupled in series between a match line 827 and a reference potential (ground in this example), with a gate terminal of transistor 911 being coupled to receive the data value from storage element 901 and a gate terminal of transistor 912 being coupled to receive a complemented comparand bit from comparand line $\overline{\text{CL}}$. Similarly, transistors 913 and 914 are coupled in series between the match line 827 and the reference potential, with a gate terminal of transistor 913 being coupled to receive a complemented version of the data value stored in storage element 901, and a gate terminal of transistor 914 being coupled to receive an uncomplemented comparand bit from comparand line CL. By this arrangement, if the comparand value and the stored data value do not match, the match line 827 will be pulled low through one of the transistor pairs 911/912 or 913/914, thereby signaling the mismatch condition. For example, if the comparand is high and the stored data value is low, then transistors 913 and 914 will be switched on to pull the match line 827 low. Conversely, if the comparand is low and the stored data value is high, transistors 911 and 912 will be switched on to pull the match line 827 low. If the comparand and data value match, then neither transistor pair 911/912 nor 913/914 will be fully switched on, thereby interrupting the path to the reference potential (so that the match line is not pulled low) to indicate the match condition. It should be noted that additional circuitry may be included within the CAM cell 801, including without limitation, timing control circuitry interposed between the ground reference and source terminals of transistors 912 and 914 of the compare circuit 910 to provide for timing control over the comparison of the comparand value and stored data value. Further, although a specific compare circuit implementation has been described in reference to FIG. 31, any other circuit that may be used to detect a match condition (or mismatch condition) may be used in alternative embodiments.

The validity CAM cell 802 of FIG. 27 may be implemented in a manner similar to the CAM cell 801 shown in FIG. 31, except that a reset line is provided to clear the value stored in storage element 901. More generally, any storage cell capable of storing a validity bit and affecting a logical state of the match line 827 according to the value of the validity bit may be used to implement the validity CAM cell 802. Also, it should be noted that the error CAM array 800 described in reference to FIG. 27 (including the queue control circuit 807 and storage CAM cell 801 described in reference to FIGS. 28 and 30) may be used to implement the error CAM 751 of FIG. 26. In such an implementation, neither the read bit lines (RBL and $\overline{\text{RBL}}$) nor the read word line 823 need be connected to the storage CAM cells 801. Also, the CAM cell 801 may have one or two signal ports, instead of the three signal ports (read, write, comparand) shown in FIG. 31.

Referring briefly to FIG. 27, it should be noted that, because separate read bit lines (RBL and $\overline{\text{RBL}}$), write bit lines (WBL and $\overline{\text{WBL}}$) and comparand lines (CL and $\overline{\text{CL}}$) are provided, a comparand may be compared with error values stored within the error CAM array 800 concurrently with output of the error address value via the read port (i.e., read bit lines RBL and $\overline{\text{RBL}}$), and concurrently with storage of a new error address value within the error CAM array 800. Because the data value stored within a given row of CAM cells may have an unknown logic state during a write operation, it may be desirable to provide circuitry to prevent match indication by a row of CAM cells being loaded with an error address value.

FIG. 32 illustrates a match disable transistor 933 that may be coupled to each match line 827 within the error CAM array 800 of FIG. 27 to prevent a match signal from being asserted on the match line while a corresponding row of CAM cells 932 is being loaded with an error address value. A drain terminal of the match disable transistor 933 is coupled to the match line 827, a source terminal of the match disable transistor 933 is coupled to a reference potential (ground in this example), and a gate terminal of the match disable transistor 933 is coupled to the write word line 825 for the corresponding row of CAM cells 932. During a load operation directed to the row of CAM cells 932, the corresponding write word line 825 will be asserted, thereby switching on match disable transistor 933 and pulling the match line 827 low. Thus, the match disable transistor 933 prevents a match indication for the row of CAM cells 932 during the load operation.

Figure 33:
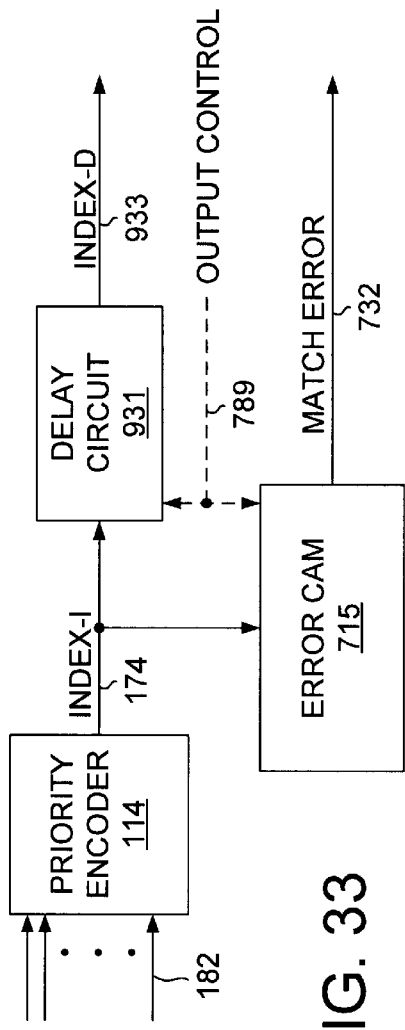
FIG. 33 illustrates the use of a delay circuit to synchronize the output of a match index and a match error signal.

FIG. 33 illustrates the use of a delay circuit 931 to synchronize the output of a match index 933 and a match error signal 732. The priority encoder 114 outputs a match index 174 to the error CAM 715 and to the delay circuit 931. The match index 174 is designated "INDEX-I" in FIG. 33 to indicate that it is an intermediate index signal. The error CAM 715 performs the comparison operation described above to determine if the match index 174 matches any error address values stored within the error CAM array and outputs a match error signal 732 accordingly. The delay circuit 931 delays the output of the match index 933 (designated "INDEX-D" in FIG. 33 to indicate that the match index 933 is a delayed version of the match index 174) such that the match index 933 and the match error 732 are output concurrently (i.e., at least partly overlapping in time). In one embodiment, the delay circuit 931 is implemented by one or more delay elements coupled in series to delay the match index 174 by a predetermined time that corresponds to the time required for the error CAM 715 to generate the match error signal 732. In an alternative embodiment, the delay circuit 931 may be implemented by a register or other edge-triggered circuit that outputs the match index 933 in response to an output control signal (shown by dashed line 789), supplied, for example by an instruction decoder (e.g., element 105 of FIG. 24) or other circuit within the CAM device. The output control signal 789 may also be coupled to a register or other edge-triggered circuit within the error CAM 715 to time the output of the match error signal 732. By this arrangement the match index 933 and the match error signal 732 may be output in response to the same control signal and, therefore, at substantially the same time. Although error CAM 715 is depicted in FIG. 33, the delay circuit 931 may also be used to synchronize the match index signal 933 with the match index signal 732 output by the error CAM 751 of FIG. 25.

Figure 34:
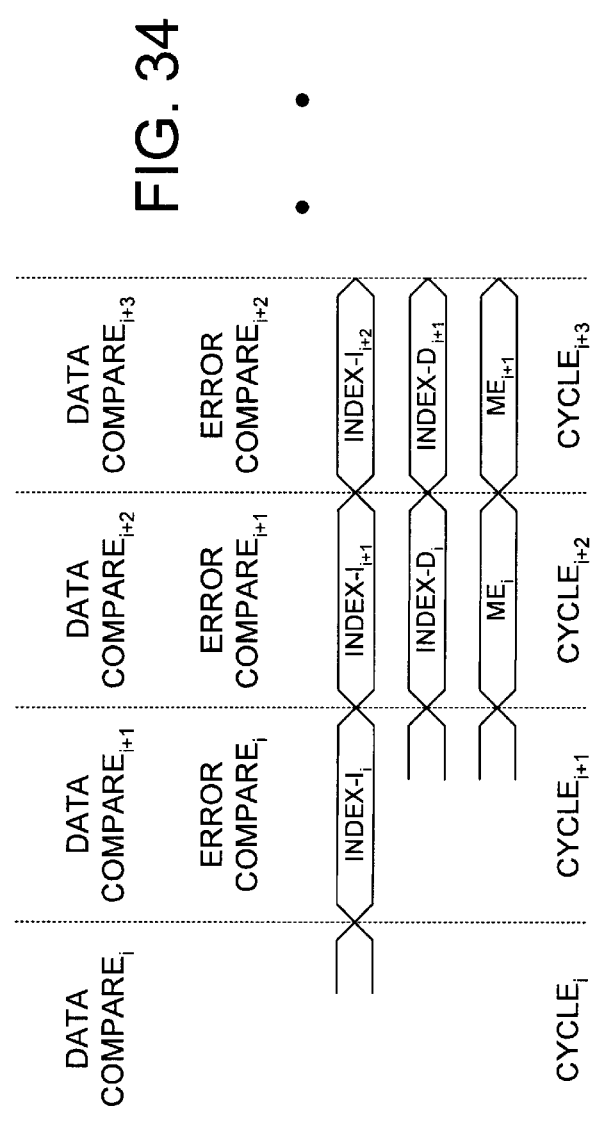
FIG. 34 is a timing diagram that illustrates the pipelining of data and error compare operations.

FIG. 34 is a timing diagram that illustrates the pipelining of data and error compare operations within a CAM device, and the relative output times of an intermediate match index, delayed match index and match error signals (i.e., signals 174, 933 and 732, respectively, described in reference to FIG. 33). During a first timing cycle, cycle$_i$ (which may be defined, for example, by one or more cycles of a clock signal, or a predetermined time interval), a corresponding data compare operation, data compare$_i$, is performed. During the subsequent timing cycle, cycle$_{i+1}$, the intermediate index signal, INDEX-I$_i$, resulting from data compare$_i$ is output and the corresponding error compare operation, error compare$_i$ is performed. Data compare$_{i+1}$ is also performed during cycle$_{i+1}$. During cycle$_{i+2}$, the delayed index signal, INDEX-D$_i$, resulting from data compare$_i$ is output, as is the corresponding match error signal, ME$_i$. Also during cycle$_{i+2}$, data compare$_{i+2}$ is performed, intermediate index signal INDEX-I$_{i+1}$ is output and error compare$_{i+1}$ is performed. Similarly, during cycle$_{i+3}$, the delayed index signal INDEX-D$_{i+1}$, resulting from data compare$_{i+1}$ is output along with the corresponding match error signal, ME$_{i+1}$, data compare$_{i+3}$ is performed, intermediate index signal INDEX-I$_{i+2}$ is output, and error compare$_{i+2}$ is performed. Thus, it can be seen that by pipelining the data compare and error compare operations, an updated match index (INDEX-D) and corresponding error signal may be output during each new timing cycle, despite the additional time required to perform the error compare operation. Accordingly, the overall throughput of the CAM device is not reduced.

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A content addressable memory (CAM) device comprising:

a first CAM array to store data words, compare the data words with a comparand value, and, if one of the data words matches the comparand value, assert a match signal that corresponds to the one of the data words;

a priority encoder coupled to receive the match signal from the first CAM array and having circuitry to output, in response to the match signal, a match address that corresponds to the one of the data words; and a second CAM array to store at least one error address value, the second CAM array being coupled to receive the match address from the priority encoder and having circuitry to compare the match address with the error address value and to assert a match error signal if the match address matches the error address value.

2. The CAM device of claim 1 further comprising:

an error detection circuit to detect a corrupted data word stored within the first CAM array and to assert an error signal to indicate the error; and a control circuit coupled to receive the error signal from the error detection circuit and being adapted to respond to the error signal by enabling the second CAM array to store the at least one error address value, the at least one error address value being indicative of a location within the first CAM array at which the corrupted data word is stored.

3. The CAM device of claim 2 wherein the control circuit includes a first counter circuit to indicate an available storage location within the second CAM array, and wherein the control circuit is adapted to enable the second CAM array to store the at least one error address value in the available storage location.

4. The CAM device of claim 3 wherein the control circuit is further adapted to increment the first counter circuit to point to another available storage location within the second CAM array upon storage of the at least one error address value in the second CAM array.

5. The CAM device of claim 1 wherein the second CAM array comprises:
   a plurality of rows of CAM cells to store respective error address values, including the at least one error address value; and
   an output port coupled to at least one of the rows of CAM cells to output a least recently stored one of the error address values.

6. The CAM device of claim 5 further comprising a read counter to selectively couple the at least one of the rows of CAM cells to the output port to output the least recently stored one of the error address values.

7. The CAM device of claim 6 further comprising a control circuit to increment the read counter in response to a control signal.

8. The CAM device of claim 1 wherein the second CAM array comprises:
   a plurality of rows of CAM cells to store a plurality of error address values, including the at least one error address value;
   a plurality of comparand lines coupled to provide the match address from the priority encoder to the plurality of rows of CAM cells;
   a plurality of match lines coupled respectively to the plurality of rows of CAM cells; and
   wherein each row of the CAM cells includes circuitry to compare the match address with an error address value stored within the row of CAM cells and to assert a match signal on a respective one of the match lines if the match address matches the error address value stored within the row of CAM cells.

9. The CAM device of claim 8 further comprising a match logic circuit coupled to the plurality of match lines, the match logic circuit being adapted to assert the match error signal if a match signal is asserted on at least one of the match lines.

10. The CAM device of claim 9 wherein the match logic circuit comprises a logic OR gate having a plurality of inputs coupled to the match lines.

11. A content addressable memory (CAM) device comprising:
   a first CAM array;
   a priority encoder coupled to the first CAM array to generate a match index that corresponds to a storage location within the first CAM array; and
   a second CAM array to store at least one error address value, the second CAM array being coupled to receive the match index from the priority encoder and including compare circuitry to compare the match index to the error address value and to assert a match error signal if the match index matches the error address value.

12. The CAM device of claim 11 further comprising:
   a check address generator coupled to output a sequence of check addresses to the first CAM array and to the second CAM array; and
   an error detection circuit to determine, for each of the check addresses, whether a data word stored within the first CAM array at the check address has an error and to assert an error signal that corresponds to the check address if the data word has an error; and
   a control circuit coupled to the error detection circuit and to the second CAM array, the control circuit being responsive to the error signal asserted by the error detection circuit to enable the second CAM array to store the corresponding check address.

13. The CAM device of claim 12 further comprising a delay circuit coupled to receive the match index from the priority encoder and to output the match index after a predetermined time, the predetermined time being selected such that the match index is output from the delay circuit concurrently with the match error signal being output from the second CAM array.

14. The CAM device of claim 13 wherein the CAM device includes a clock input to receive a clock signal, and wherein the predetermined time is selected such that the match index and the match error signal are both output during the same cycle of the clock signal.

15. A method of operation within a content addressable memory (CAM) device, the method comprising:
   determining an address of a data word that matches a comparand value;
   determining an address of a data word having an error; and
   comparing the address of the data word that matches the comparand value with the address of the data word having an error.

16. The method of claim 15 further comprising asserting a match error signal if the address of the data word having an error matches the address of the data word that matches the comparand value.

17. The method of claim 15 further comprising outputting a match error signal having either a first state or a second state according to whether the address of the data word having an error matches the address of the data word that matches the comparand value.

18. The method of claim 17 further comprising outputting the address of the data word that matches the comparand value after delaying for a predetermined time.

19. The method of claim 18 wherein the predetermined time corresponds to a time required to determine whether the address of the data word having an error matches the address of the data word that matches the comparand value.

20. The method of claim 18 wherein the predetermined time is selected such that the address of the data word that matches the comparand is output concurrently with the match error signal.

21. The method of claim 15 wherein determining an address of a data word that matches a comparand value comprises performing a comparison operation within a first CAM array of the CAM device, and wherein comparing the address of the data word that matches the comparand value with the address of the data word having an error comprises performing a comparison operation within a second CAM array of the CAM device.

22. A content addressable memory (CAM) device comprising:
   a first CAM array;
   means for determining an address within the first CAM array of a data word that matches a comparand value;
   means for determining an address within the first CAM array of a data word having an error; and
   means for comparing the address of the data word that matches the comparand value with the address of the data word having an error.

23. The CAM device of claim 22 further comprising means for asserting a match error signal if the address of the data word having an error matches the address of the data word that matches the comparand value.

24. The CAM device claim 22 further comprising means for outputting a match error signal having either a first state or a second state according to whether the address of the data word having an error matches the address of the data word that matches the comparand value.

25. The CAM device of claim 24 further comprising means for delaying a predetermined time before the address of the data word that matches the comparand value is output from the CAM device, the predetermined time corresponding to a time required to determine whether the address of the data word having an error matches the address of the data word that matches the comparand value.

26. The CAM device of claim 22 wherein the means for determining an address of a data word that matches a comparand value comprises means for performing a comparison operation within the first CAM array, and wherein the means for comparing the address of the data word that matches the comparand value with the address of the data word having an error comprises means for performing a comparison operation within a second CAM array of the CAM device.

27. A content addressable memory (CAM) device comprising:
   a first CAM array;
   a priority encoder coupled to the first CAM array to generate a match index that corresponds to a storage location within the first CAM array; and
   an error storage circuit to store at least one error address value; and
   a compare circuit coupled to receive the error address value from the error storage circuit and coupled to receive the match index from the priority encoder, the compare circuit being adapted to compare the error address value with the match index and to assert a match error signal if the error address value matches the match index.

28. The CAM device of claim 27 further comprising:
   a check address generator coupled to output a sequence of check addresses to the first CAM array and to the error storage circuit; and
   an error detection circuit to determine, for each of the check addresses, whether a data word stored within the first CAM array at the check address has an error and to assert an error signal that corresponds to the check address if the data word has an error; and
   a control circuit coupled to the error detection circuit and to the error storage circuit, the control circuit being responsive to the error signal asserted by the error detection circuit to enable the error storage circuit to store the corresponding check address.

29. The CAM device of claim 27 further including an error flag circuit to assert an error flag signal indicative of whether a valid error address value is stored within the error storage circuit.

30. The CAM device of claim 29 wherein the compare circuit is coupled to receive the error flag signal from the error flag circuit, the compare circuit including circuitry to prevent assertion of the match error signal if the error flag signal is not asserted.

* * * * *